United States Patent
Chung et al.

(10) Patent No.: US 11,574,892 B2
(45) Date of Patent: Feb. 7, 2023

(54) SEMICONDUCTOR PACKAGE HAVING PADS WITH STEPPED STRUCTURE

(71) Applicant: SAMSUNG ELECTRONICS CO., LTD., Suwon-si (KR)

(72) Inventors: Myung Kee Chung, Hwaseong-si (KR); Hyun Soo Chung, Hwaseong-si (KR); Tae Won Yoo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 11 days.

(21) Appl. No.: 17/216,334

(22) Filed: Mar. 29, 2021

(65) Prior Publication Data

US 2022/0068886 A1 Mar. 3, 2022

(30) Foreign Application Priority Data

Sep. 3, 2020 (KR) .................. 10-2020-0112294

(51) Int. Cl.
*H01L 25/065* (2006.01)
*H01L 25/00* (2006.01)

(52) U.S. Cl.
CPC .......... *H01L 25/0657* (2013.01); *H01L 25/50* (2013.01); *H01L 2225/06513* (2013.01); *H01L 2225/06541* (2013.01); *H01L 2225/06586* (2013.01)

(58) Field of Classification Search
CPC ............... H01L 25/0657; H01L 25/50; H01L 2225/06513; H01L 2225/06541; H01L 2225/06586
See application file for complete search history.

(56) References Cited

U.S. PATENT DOCUMENTS

| | | | |
|---|---|---|---|
| 9,530,706 B2 | 12/2016 | Kang et al. | |
| 9,653,430 B2 | 5/2017 | Kim et al. | |
| 10,163,837 B2 | 12/2018 | Hwang et al. | |
| 10,510,710 B2 | 12/2019 | Yu et al. | |
| 10,522,489 B1 | 12/2019 | Takiar et al. | |
| 11,348,807 B2* | 5/2022 | Kang | ................... H01L 25/50 |
| 2017/0323863 A1 | 11/2017 | Lee et al. | |
| 2019/0312013 A1 | 10/2019 | Seo et al. | |
| 2021/0118803 A1* | 4/2021 | Park | ................... H01L 24/14 |

(Continued)

FOREIGN PATENT DOCUMENTS

KR 20120122635 A 11/2012
KR 102061420 B1 12/2019

*Primary Examiner* — Thao P Le
(74) *Attorney, Agent, or Firm* — Volentine, Whitt & Francos, PLLC

(57) ABSTRACT

A semiconductor package including a first semiconductor chip, a second semiconductor chip disposed on the first semiconductor chip, and a third semiconductor chip disposed on the second semiconductor chip. A first pad is disposed on a top surface of the second semiconductor chip, and includes a first portion and a second portion protruding in a vertical direction from the first portion. A width of the first portion in a first horizontal direction is greater than a width of the second portion in the first horizontal direction. A second pad is disposed on a bottom surface of the third semiconductor chip facing the top surface of the second semiconductor chip, and a solder ball is disposed as surrounding a sidewall of the second portion of the first pad between the first pad and the second pad.

20 Claims, 33 Drawing Sheets

(56) References Cited

U.S. PATENT DOCUMENTS

| | | | |
|---|---|---|---|
| 2021/0159178 A1* | 5/2021 | Nam | H01L 24/17 |
| 2021/0398929 A1* | 12/2021 | Kim | H01L 25/50 |
| 2021/0407879 A1* | 12/2021 | Patel | H01L 23/3672 |
| 2022/0068886 A1* | 3/2022 | Chung | H01L 25/50 |
| 2022/0093543 A1* | 3/2022 | Seo | H01L 24/81 |
| 2022/0157702 A1* | 5/2022 | Choi | H01L 24/16 |

\* cited by examiner

SEMICONDUCTOR PACKAGE HAVING PADS WITH STEPPED STRUCTURE

CROSS-REFERENCE TO RELATED APPLICATION

A claim for priority under 35 U.S.C. § 119 is made to Korean Patent Application No. 10-2020-0112294 filed on Sep. 3, 2020 in the Korean Intellectual Property Office, the entirety of which is hereby incorporated by reference.

BACKGROUND

The present disclosure relates to semiconductor packages, and more particularly to semiconductor packages having pads with stepped structure.

Recently, as the need for implementing high-performance devices has increased, the size of semiconductor chips and corresponding semiconductor packages have also increased. On the other hand, there is a desire to decrease the thickness of semiconductor packages so that electronic devices may be made slimmer.

In the meantime, semiconductor packages have been developed to have greater multi-functionality, higher capacity, and improved miniaturization. To this end, several semiconductor chips are typically integrated into one semiconductor package, thereby achieving high-capacity and multifunctional semiconductor packages while greatly reducing the size of the semiconductor packages.

SUMMARY

Embodiments of the inventive concepts provide a semiconductor package including a first semiconductor chip; a second semiconductor chip on the first semiconductor chip; a third semiconductor chip on the second semiconductor chip; a first pad on a top surface of the second semiconductor chip, the first pad including a first portion and a second portion protruding in a vertical direction from the first portion, a width of the first portion in a first horizontal direction being greater than a width of the second portion in the first horizontal direction; a second pad on a bottom surface of the third semiconductor chip, the bottom surface facing the top surface of the second semiconductor chip; and a solder ball surrounding a sidewall of the second portion of the first pad between the first pad and the second pad.

Embodiments of the inventive concepts further provide a semiconductor package including a first structure; a second structure on the first structure; a first pad on a top surface of the first structure, the first pad including a first portion and a second portion protruding in a vertical direction from the first portion, a width of the first portion in a first horizontal direction being greater than a width of the second portion in the first horizontal direction; a second pad on a bottom surface of the second structure, the bottom surface facing the top surface of the first structure; and a solder ball between the first pad and the second pad, the solder ball surrounding a sidewall of the second portion of the first pad. The second portion of the first pad is in contact with the second pad, and a width of the solder ball in the first horizontal direction is smaller than the width of the first portion of the first pad in the first horizontal direction.

Embodiments of the inventive concepts still further provide a semiconductor package including a first semiconductor chip; a second semiconductor chip on the first semiconductor chip; a third semiconductor chip on the second semiconductor chip; a first pad on a top surface of the second semiconductor chip, the first pad including a first portion and a second portion protruding in a vertical direction from the first portion, a width of the first portion in a first horizontal direction being greater than a width of the second portion in the first horizontal direction, a width of the first portion in a second horizontal direction perpendicular to the first horizontal direction being greater than a width of the second portion in the second horizontal direction; a second pad on a bottom surface of the third semiconductor chip, the bottom surface facing the top surface of the second semiconductor chip; a first solder ball on a bottom surface of the first semiconductor chip; a second solder ball between the first pad and the second pad, and surrounding a sidewall of the second portion of the first pad; a through via penetrating the second semiconductor chip in the vertical direction and connected to the first pad; and an adhesive layer disposed between the second semiconductor chip and the third semiconductor chip, and surrounding a sidewall of each of the first pad, the second pad, and the second solder ball. A thickness of the second portion of the first pad in the vertical direction is greater than a thickness of the first portion of the first pad in the vertical direction, a thickness of the first portion of the first pad in the vertical direction is 0.1 µm to 2 µm, and a thickness of the second portion of the first pad in the vertical direction is 0.1 µm to 5 µm.

Embodiments of the inventive concepts also provide a semiconductor package including a first semiconductor chip having a first surface; a second semiconductor chip over the first semiconductor chip, the second semiconductor chip having a first surface facing the first surface of the first semiconductor chip; a first pad on the first surface of the first semiconductor chip, the first pad including a first portion and a second portion protruding from the first portion in a first direction toward the first surface of the second semiconductor chip, a width of the first portion in a second direction extending along the first surface of the first semiconductor chip being greater than a width of the second portion in the second direction; a second pad on the first surface of the second semiconductor chip; and a solder ball between the first and second pads, and surrounding a sidewall of the second portion of the first pad.

BRIEF DESCRIPTION OF THE DRAWINGS

The above and other aspects and features of the present disclosure will become more apparent in view of the following detailed description of exemplary embodiments as made with reference to the attached drawings, in which.

DETAILED DESCRIPTION OF THE EMBODIMENTS

Hereinafter, a semiconductor package according to some embodiments of the inventive concepts will be described with reference to FIGS. 1 to 3.

Figure 1:
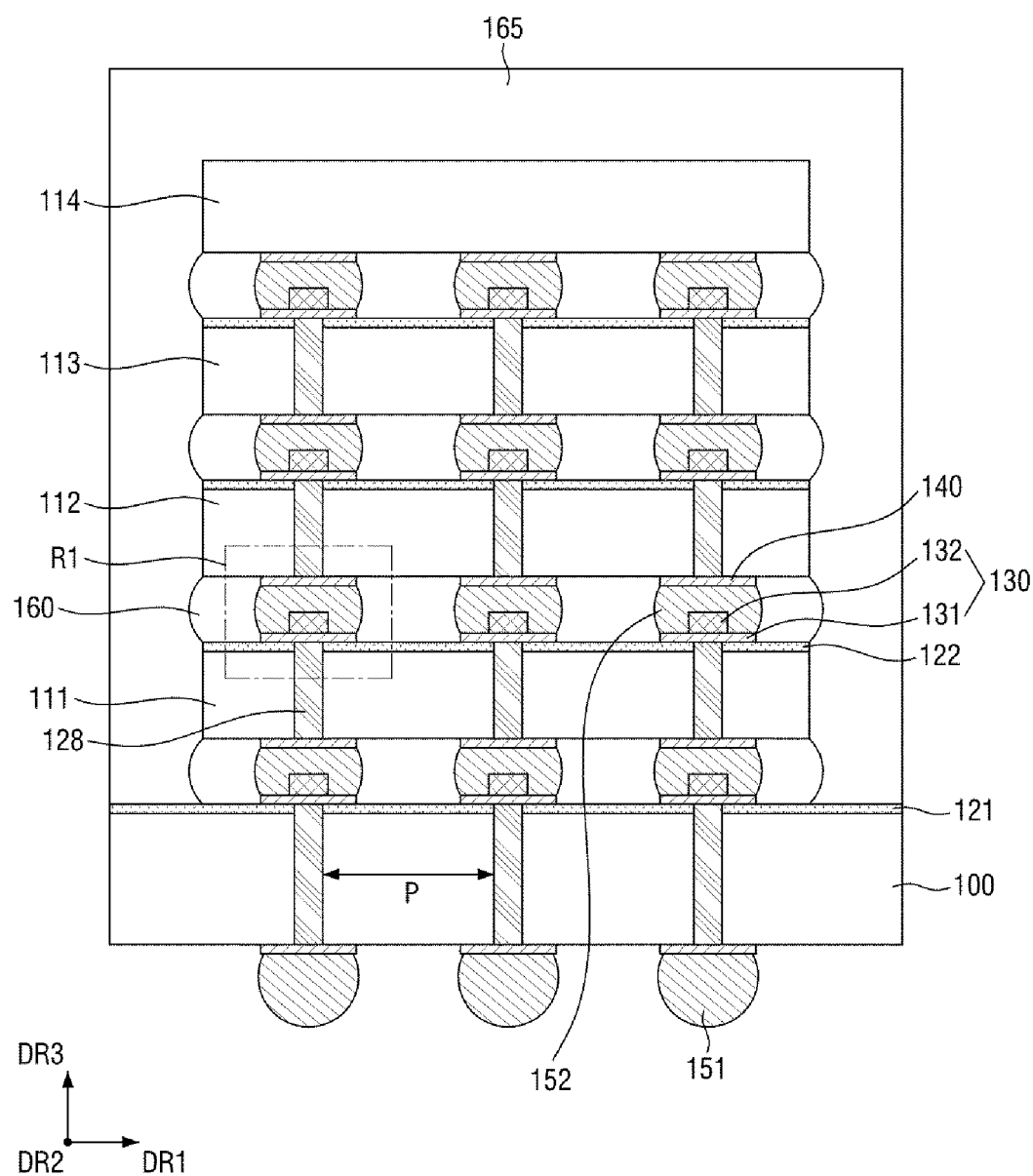
FIG. 1 illustrates a semiconductor package according to some embodiments of the inventive concepts.

FIG. 1 illustrates a semiconductor package according to some embodiments of the inventive concepts. FIG. 2 illustrates an enlarged view of area R1 of FIG. 1. FIG. 3 illustrates a plan view of a first pad shown in FIG. 1.

Figure 2:
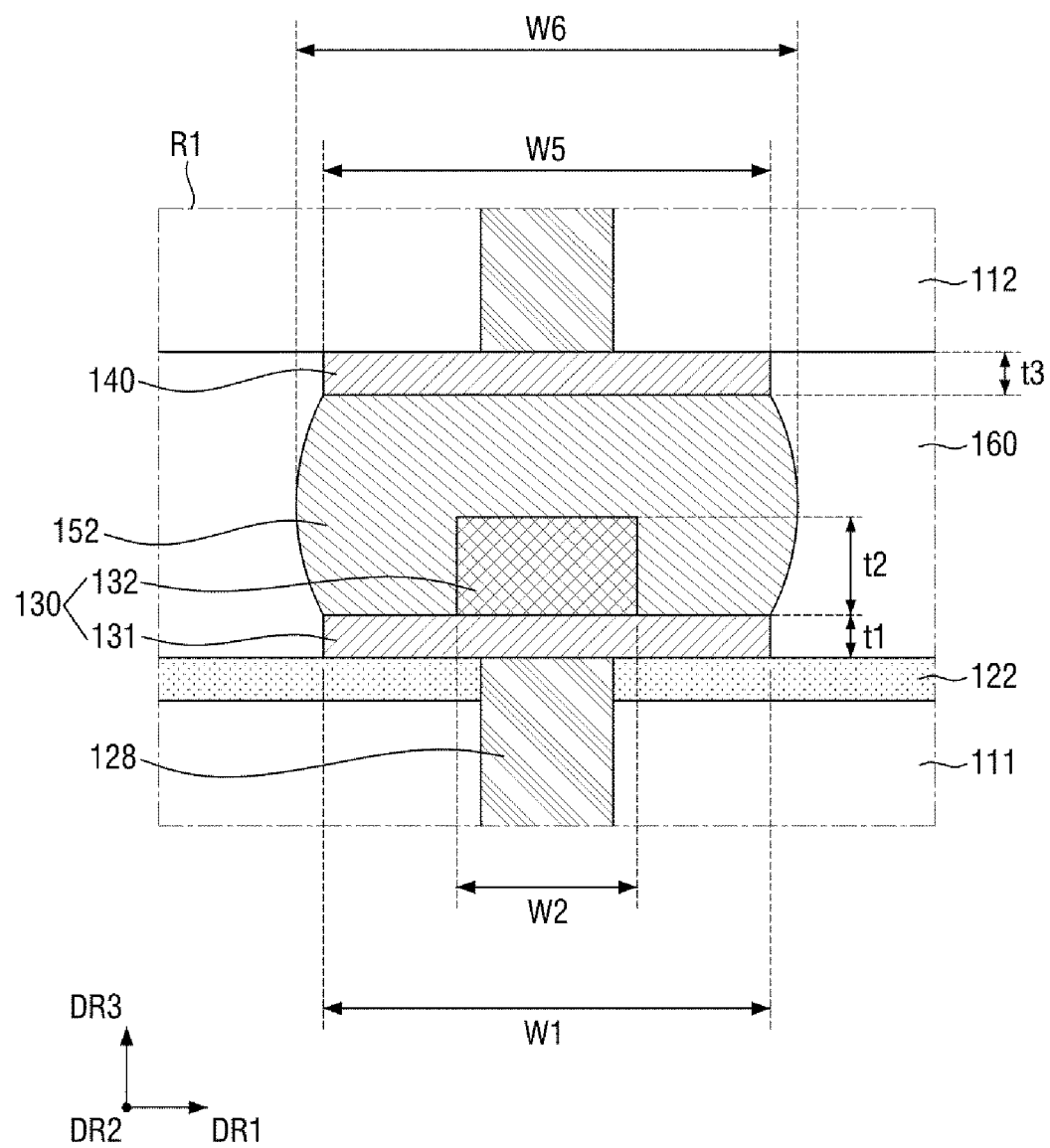
FIG. 2 illustrates an enlarged view of area R1 of FIG. 1.
Figure 3:
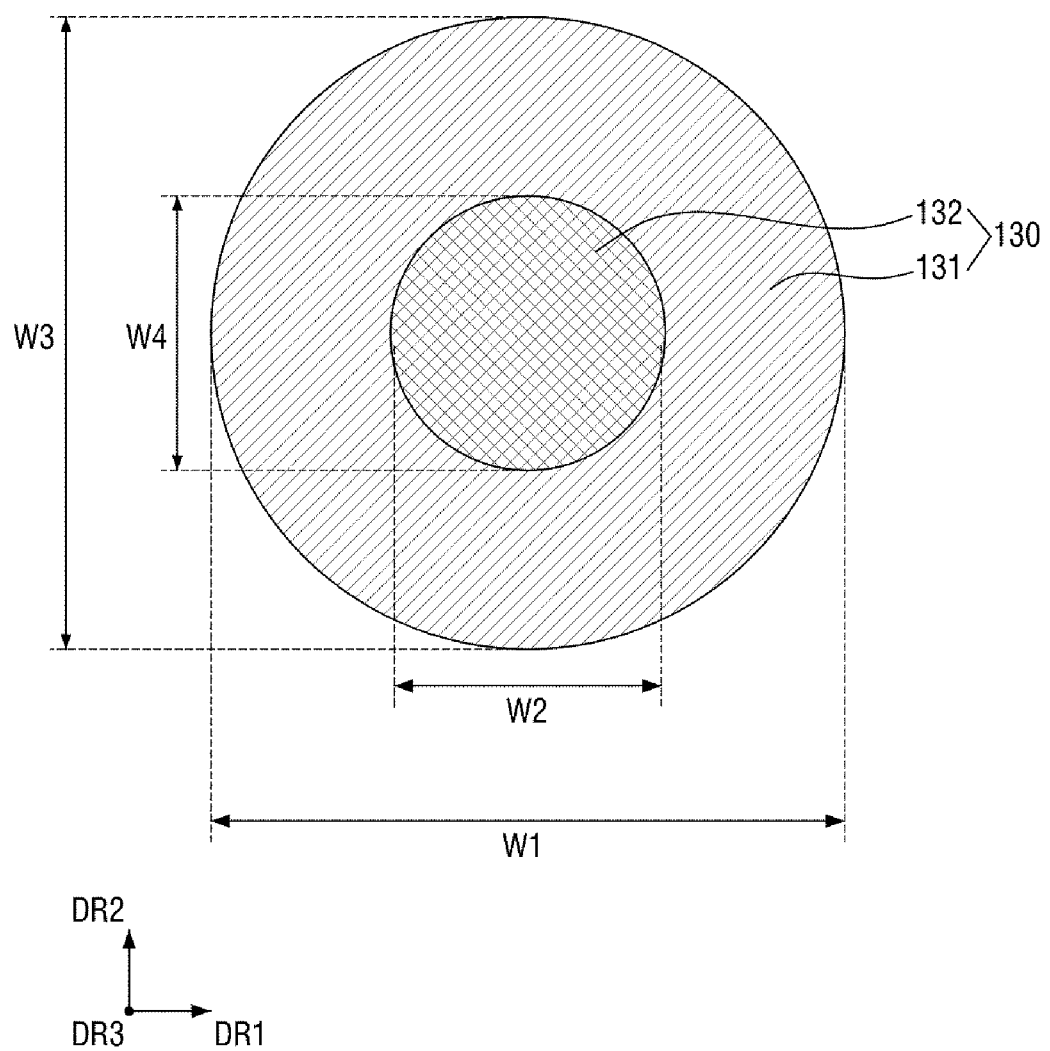
FIG. 3 illustrates a plan view of a first pad shown in FIG. 1.

Referring to FIGS. 1 to 3, a semiconductor package according to some embodiments of the inventive concepts includes first to fifth semiconductor chips 100, 111, 112, 113, and 114, a first insulating layer 121, a second insulating layer 122, a through via 128, a first pad 130, a second pad 140, a first solder ball 151, a second solder ball 152, an adhesive layer 160, and a mold layer 165.

The first to fifth semiconductor chips 100, 111, 112, 113, and 114 may be memory semiconductor chips. The memory semiconductor chips may be, for example, volatile memory semiconductor chips such as dynamic random access memory (DRAM) or static random access memory (SRAM), or nonvolatile memory semiconductor chips such as phase-change random access memory (PRAM), magnetoresistive random access memory (MRAM), ferroelectric random access memory (FeRAM) or resistive random access memory (RRAM). The first semiconductor chip 100 may be, for example, a buffer semiconductor chip.

In some other embodiments, the first semiconductor chip 100 may be a logic semiconductor chip, and the second to fifth semiconductor chips 111, 112, 113, and 114 may be memory semiconductor chips. For example, the first semiconductor chip 100 may be a controller semiconductor chip that controls operations such as input/output of the second to fifth semiconductor chips 111, 112, 113, and 114 electrically connected to the first semiconductor chip 100.

In FIG. 1, it is shown that five semiconductor chips are stacked in the semiconductor package, but this is merely for simplicity of description and should not be limiting. In other embodiments the semiconductor package may include more or less than five semiconductor chips.

The first semiconductor chip 100 may include a first semiconductor device layer, a first semiconductor substrate, and the first insulating layer 121. The top surface of the first semiconductor chip 100 may be defined by the first insulating layer 121, and the bottom surface of the first semiconductor chip 100 may be defined by the first semiconductor device layer. The first semiconductor substrate may be disposed between the first semiconductor device layer and the first insulating layer 121. The first insulating layer 121 may include an insulating material.

The first semiconductor substrate may be a bulk silicon or silicon-on-insulator (SOI) structure. Alternatively, the first semiconductor substrate may be a silicon substrate or may include other materials such as for example silicon germanium, silicon germanium on insulator (SGOI), indium antimonide, a lead tellurium compound, indium arsenide, indium phosphide, gallium arsenide, or gallium antimonide, among other materials. However, it should be understood that the semiconductor substrate is not limited to the above described materials.

The first semiconductor device layer may include a plurality of various types of individual devices and an interlayer insulating layer. The plurality of individual devices may include various microelectronic devices such as for example metal-oxide-semiconductor field effect transistors (MOSFETs) such as a complementary metal-oxide-semiconductor (CMOS) transistor, system large scale integration (LSI), flash memories, DRAMs, SRAMs, EEPROMs, PRAMs, MRAMs, RRAMs, image sensors such as a CMOS imaging sensor (CIS), micro-electro-mechanical systems (MEMS), active devices, passive devices, or the like. The plurality of individual devices may be electrically connected to a conductive region formed in the first semiconductor substrate. The first semiconductor device layer may include at least two of the plurality of individual devices, or a conductive wire or a conductive plug electrically connecting the plurality of individual devices to the conductive region of the first semiconductor substrate. In addition, the plurality of individual devices may each be electrically separated from other neighboring individual devices by insulating layers.

The through via 128 may be disposed inside the first semiconductor chip 100. The through via 128 may penetrate through the first semiconductor chip 100 in a vertical direction DR3.

A plurality of the through vias 128 may be disposed inside the first semiconductor chip 100. For example, the plurality of through vias 128 may be spaced apart from each other in a first horizontal direction DR1. For example, the plurality of through vias 128 may be spaced apart from each other by an interval P of 10 μm to 30 μm in the first horizontal direction DR1.

The through vias 128 may extend in different shapes depending on a point of time of their formation, i.e., whether they are formed before a front end of line (FEOL) process, formed between the FEOL process and a back end of line (BEOL) process, or formed during or after the BEOL process.

The second to fifth semiconductor chips 111, 112, 113, and 114 may be sequentially stacked on the first semiconductor chip 100.

For example, the second semiconductor chip 111 may include a second semiconductor device layer and a second semiconductor substrate respectively similar to the described first semiconductor device layer and the first semiconductor substrate, and the second insulating layer 122. The top surface of the second semiconductor chip 111 may be defined by the second insulating layer 122, and the bottom surface of the second semiconductor chip 111 may be defined by the second semiconductor device layer. The second semiconductor substrate may be disposed between the second semiconductor device layer and the second insulating layer 122. The second insulating layer 122 may include an insulating material.

The through via 128 may be disposed inside the second semiconductor chip 111. The through via 128 may penetrate through the second semiconductor chip 111 in the vertical direction DR3.

Each of the third semiconductor chip 112 and the fourth semiconductor chip 113 may have a structure similar to that of the second semiconductor chip 111. Accordingly, detailed description of each of the third and fourth semiconductor chips 112 and 113 will be omitted.

The fifth semiconductor chip 114 may include a semiconductor device layer and a semiconductor substrate respectively similar to the second semiconductor device layer and the second semiconductor substrate. The top surface of the fifth semiconductor chip 114 may be defined by the corresponding semiconductor substrate, and the bottom surface of the fifth semiconductor chip 114 may be defined by the corresponding semiconductor device layer. A through via 128 is not disposed inside the fifth semiconductor chip 114.

First pads such as the first pad 130 may be disposed on the top surface of each of the first to fourth semiconductor chips 100, 111, 112, and 113. Specifically and for example, the first pads such as the first pad 130 may be disposed on each of the first insulating layer 121 and the second insulating layer 122. Hereinafter, for the sake of simplicity, description of the first pad 130 may refer to any of the above noted first pads such as the first pad 130.

As shown in FIG. 2 for example, the first pad 130 may overlap the through via 128 disposed inside the first, second third or fourth semiconductor chips 100, 111, 112, and 113, in the vertical direction DR3. The first pad 130 may be electrically connected to the through via 128 disposed inside the first, second, third or fourth semiconductor chips 100, 111, 112, and 113.

The first pad 130 may include a first portion 131, and a second portion 132 protruding from the first portion 131 in the vertical direction DR3. As shown in FIG. 3, for example, each of the first portion 131 and the second portion 132 of the first pad 130 may have a circular shape in plan view. However, in other embodiments the first portion 131 and the second portion 132 may have shapes other than circular in plan view.

A width W1 of the first portion 131 of the first pad 130 in the first horizontal direction DR1 may be greater than a width W2 of the second portion 132 of the first pad 130 in the first horizontal direction DR1. In addition, a width W3 of the first portion 131 of the first pad 130 in a second horizontal direction DR2 perpendicular to the first horizontal direction DR1 may be greater than a width W4 of the second portion 132 of the first pad 130 in the second horizontal direction DR2. That is, the edge of the first portion 131 of the first pad 130 does not overlap the second portion 132 of the first pad 130 in the vertical direction DR3.

For example, the difference between the width W1 of the first portion 131 of the first pad 130 in the first horizontal direction DR1 and the width W2 of the second portion 132 of the first pad 130 in the first horizontal direction DR1 may be 1 μm to 8 μm. For example, a ratio of the width W1 of the first portion 131 of the first pad 130 in the first horizontal direction DR1 with respect to a distance P between the plurality of through vias 128 in the first horizontal direction DR1 may be 40% to 80%.

For example, a thickness t1 of the first portion 131 of the first pad 130 in the vertical direction DR3 may be 0.1 μm to 2 μm. For example, a thickness t2 of the second portion 132 of the first pad 130 in the vertical direction DR3 may be 0.1 μm to 5 μm.

The first pad 130 may include, for example, at least one of aluminum (Al), copper (Cu), nickel (Ni), tungsten (W), platinum (Pt), or gold (Au).

Pads such as the second pad 140 may be disposed on the bottom surface of each of the first to fifth semiconductor chips 100, 111, 112, 113, and 114. As shown in FIG. 2 for example, the second pad 140 may overlap the first pad 130 in the vertical direction DR3. For example, the second pad 140 disposed on the bottom surface of the third semiconductor chip 112 may be disposed to face the first pad 130 disposed on the top surface of the second semiconductor chip 111.

The pads such as the second pad 140 disposed on the bottom surface of each of the first to fourth semiconductor chips 100, 111, 112, and 113 may be electrically connected to the through via 128 disposed inside the first, second, third or fourth semiconductor chips 100, 111, 112, and 113.

A width W5 of the second pad 140 in the first horizontal direction DR1 may be the same as the width W1 of the first portion 131 of the first pad 130 in the first horizontal direction DR1. However, in other embodiments the widths W1 and W5 may not be the same as each other.

For example, a thickness t3 of the second pad 140 in the vertical direction DR3 may be 0.1 μm to 7 μm. In some embodiments, the thickness t3 of the second pad 140 in the vertical direction DR3 may be the same as the thickness t1 of the first portion 131 of the first pad 130 in the vertical direction DR3. In some other embodiments, the thickness t3 of the second pad 140 in the vertical direction DR3 may be equal to the sum of the thickness t1 of the first portion 131 of the first pad 130 in the vertical direction DR3 and the thickness t2 of the second portion 132 of the first pad 130 in the vertical direction DR3.

The second pad 140 may include, for example, at least one of aluminum (Al), copper (Cu), nickel (Ni), tungsten (W), platinum (Pt), or gold (Au).

The first solder ball(s) 151 may be disposed under the first semiconductor chip 100. The first solder ball 151 may contact a second pad 140 disposed on the bottom surface of the first semiconductor chip 100. The first solder ball 151 may be disposed to protrude from a second pad 140 disposed on the bottom surface of the first semiconductor chip 100.

The first solder ball 151 may include, for example, tin (Sn), indium (In), bismuth (Bi), antimony (Sb), copper (Cu), silver (Ag), zinc (Zn), lead (Pb) and/or an alloy thereof. For example, the first solder ball 151 may include Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, or the like.

The second solder ball(s) 152 may be disposed between the first to fifth semiconductor chips 100, 111, 112, 113, and 114. As shown in FIG. 2 for example, the second solder ball 152 may be disposed between the first pad 130 and the second pad 140. For example, the second solder ball 152 may be disposed between the first pad 130 provided on the top surface of the second semiconductor chip 111, and the second pad 140 provided on the bottom surface of the third semiconductor chip 112.

The second solder ball 152 may contact each of the first pad 130 and the second pad 140. The second solder ball 152 may contact each of the top surface of the first portion 131 of the first pad 130 and the bottom surface of the second pad 140. The second solder ball 152 may surround the sidewall of the second portion 132 of the first pad 130. The second solder ball 152 may contact the top surface of the second portion 132 of the first pad 130. In FIGS. 1 and 2, it is shown that the second solder ball 152 does not contact each of the sidewall of the first pad 130 and the sidewall of the second pad 140. However, in other embodiments the second solder ball 152 may contact each of the sidewall of the first pad 130 and the sidewall of the second pad 140.

A width W6 of the second solder ball 152 in the first horizontal direction DR1 may be greater than the width W1 of the first portion 131 of the first pad 130 in the first horizontal direction DR1. In detail, at least a portion of the second solder ball 152 may protrude laterally beyond the side surface of the first portion 131 of the first pad 130. However, in some other embodiments the width W6 of the second solder ball 152 in the first horizontal direction DR1 may be smaller than the width W1 of the first portion 131 of the first pad 130 in the first horizontal direction DR1.

The second solder ball 152 may include, for example, tin (Sn), indium (In), bismuth (Bi), antimony (Sb), copper (Cu), silver (Ag), zinc (Zn), lead (Pb) and/or an alloy thereof. For example, the second solder ball 152 may include Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, or the like.

The adhesive layer 160 may be disposed between the first to fifth semiconductor chips 100, 111, 112, 113, and 114. The adhesive layer 160 may surround the sidewall of the first portion 131 of the first pad 130, the sidewall of the second pad 140, and the sidewall of the second solder ball 152. The adhesive layer 160 may protrude laterally beyond the sidewall of each of the second to fifth semiconductor chips 111, 112, 113, and 114, but is not limited to protruding as described. The adhesive layer 160 may include, for example, an insulating material.

The mold layer 165 may be disposed on the top surface of the first semiconductor chip 100. The mold layer 165 may be disposed to cover the sidewall of each of the second to fifth semiconductor chips 111, 112, 113, and 114. In addition, the mold layer 165 may be disposed to cover the sidewall of the adhesive layer 160. In FIG. 1, the mold layer 165 is shown to be disposed to cover the top surface of the fifth semiconductor chip 114. However, in some other embodiments the top surface of the mold layer 165 may be formed on the same plane as the top surface of the fifth semiconductor chip 114.

The mold layer 165 may contain, for example, an epoxy molding compound (EMC) or two or more kinds of silicone hybrid materials.

In the semiconductor package according to some embodiments of the inventive concepts, the pad 130 having a stepped portion is formed, thereby improving the stability of the solder ball 152 disposed between the pads 130 and 140. Accordingly, it is possible to prevent the occurrence of a short circuit between the solder balls 152.

Hereinafter, a semiconductor package according to some other embodiments of the inventive concepts will be described with reference to FIG. 4. The following description will focus on differences between the semiconductor package of FIG. 4 and the semiconductor package illustrated in FIGS. 1 to 3, and description of like elements and configurations will be omitted.

Figure 4:
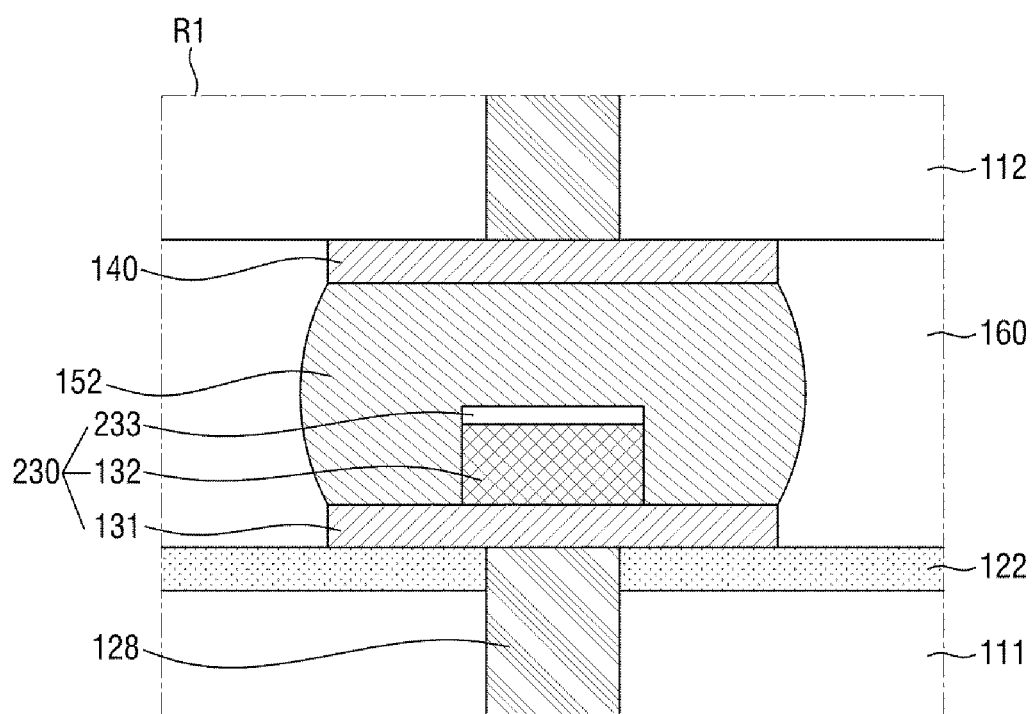
FIG. 4 illustrates an enlarged view of a semiconductor package according to some other embodiments of the inventive concepts.
Figure 4:
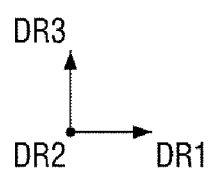

FIG. 4 illustrates an enlarged view of a semiconductor package according to some other embodiments of the inventive concepts.

In the semiconductor package according to FIG. 4, a first pad 230 may include the first portion 131, the second portion 132, and a first metal layer 233.

The first metal layer 233 may be disposed on the top surface of the second portion 132 of the first pad 230. For example, the width of the first metal layer 233 in the first horizontal direction DR1 may be the same as the width W2 (see FIG. 2) of the second portion 132 of the first pad 230 in the first horizontal direction DR1.

The first metal layer 233 may include a metal. The first metal layer 233 may include, for example, copper (Cu) or gold (Au).

Hereinafter, a semiconductor package according to still other embodiments of the inventive concepts will be described with reference to FIGS. 5 and 6. The following description will focus on differences between the semiconductor package of FIGS. 5 and 6 the semiconductor package illustrated in FIGS. 1 to 3, and description of like elements and configurations will be omitted.

Figure 5:
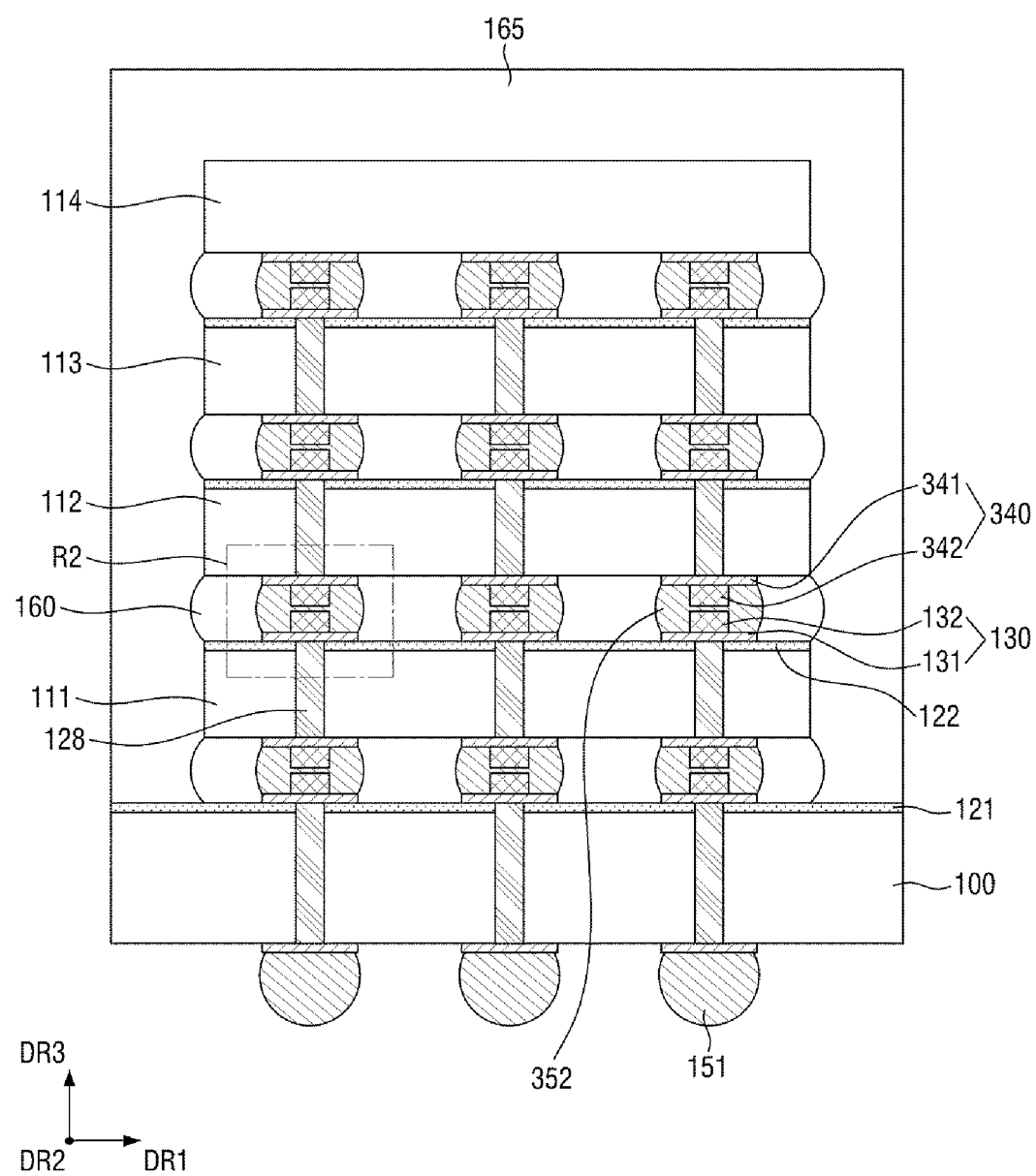
FIG. 5 illustrates a semiconductor package according to still other embodiments of the inventive concepts.

FIG. 5 illustrates a semiconductor package according to still other embodiments of the inventive concepts. FIG. 6 illustrates an enlarged view of area R2 of FIG. 5.

Figure 6:
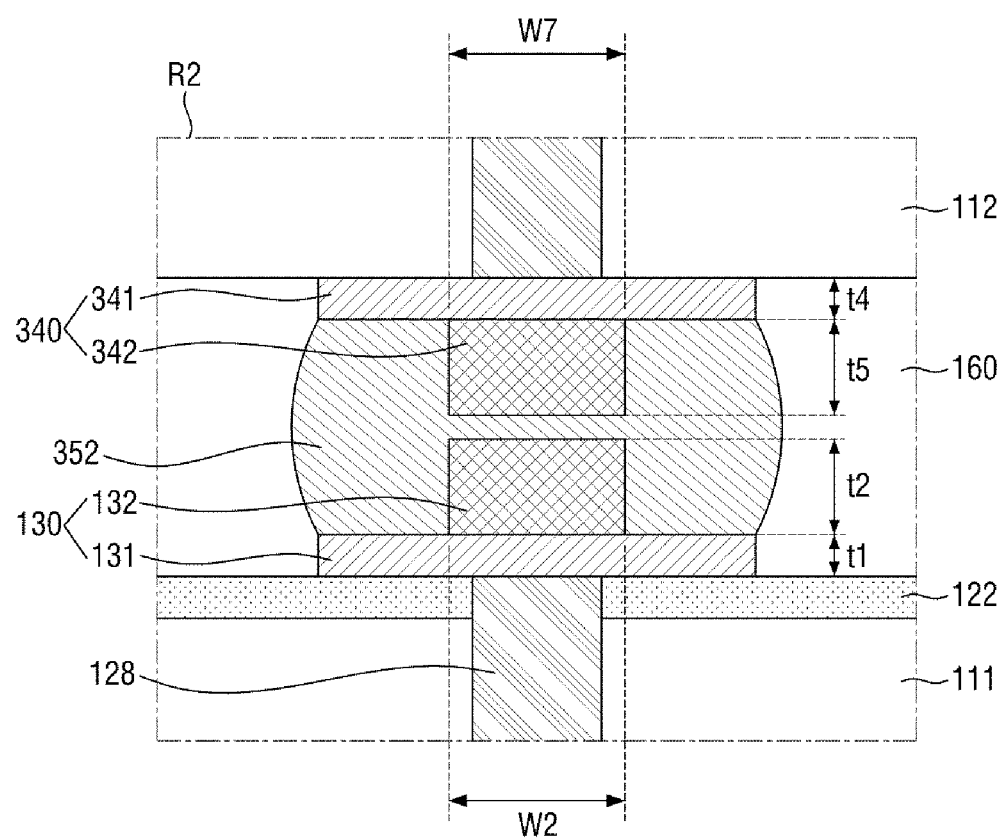
FIG. 6 illustrates an enlarged view of area R2 of FIG. 5.
Figure 6:
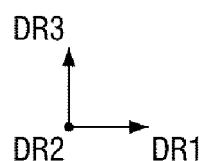

Referring to FIGS. 5 and 6, a second pad 340 may include a first portion 341 and a second portion 342.

The first portion 341 of the second pad 340 may be disposed to face the first portion 131 of the first pad 130. The width of the first portion 341 of the second pad 340 in the first horizontal direction DR1 may be the same as the width W1 (see FIG. 2) of the first portion 131 of the first pad 130 in the first horizontal direction DR1. However, in some embodiments the widths of the first portion 341 and the first portion 131 may not be the same.

A thickness t4 of the first portion 341 of the second pad 340 in the vertical direction DR3 may be the same as the thickness t1 of the first portion 131 of the first pad 130 in the vertical direction DR3. However, in some embodiments the thickness t4 and the thickness t1 may not be the same.

The second portion 342 of the second pad 340 may be disposed to face the second portion 132 of the first pad 130. The second portion 342 of the second pad 340 may protrude from the first portion 341 of the second pad 340 toward the second portion 132 of the first pad 130. The second portion 342 of the second pad 340 may be spaced apart from the second portion 132 of the first pad 130 in the vertical direction DR3.

A width W7 of the second portion 342 of the second pad 340 in the first horizontal direction DR1 may be the same as the width W2 of the second portion 132 of the first pad 130 in the first horizontal direction DR1. However, in some embodiments the widths W2 and W7 may not be the same.

A thickness t5 of the second portion 342 of the second pad 340 in the vertical direction DR3 may be the same as the thickness t2 of the second portion 132 of the first pad 130 in the vertical direction DR3. However, in some embodiments the thickness t5 and the thickness t2 may not be the same.

The second solder ball 352 may contact the top surface of the first portion 131 of the first pad 130 and the bottom surface of the first portion 341 of the second pad 340. The second solder ball 352 may surround each of the sidewall of the second portion 132 of the first pad 130 and the sidewall of the second portion 342 of the second pad 340. The second solder ball 352 may be disposed between the top surface of the second portion 132 of the first pad 130 and the bottom surface of the second portion 342 of the second pad 340.

Hereinafter, a semiconductor package according to still other embodiments of the inventive concepts will be described with reference to FIG. 7. The following description will focus on differences between the semiconductor package of FIG. 7 and the semiconductor package illustrated in FIGS. 5 and 6, and description of like elements and configurations may be omitted.

Figure 7:
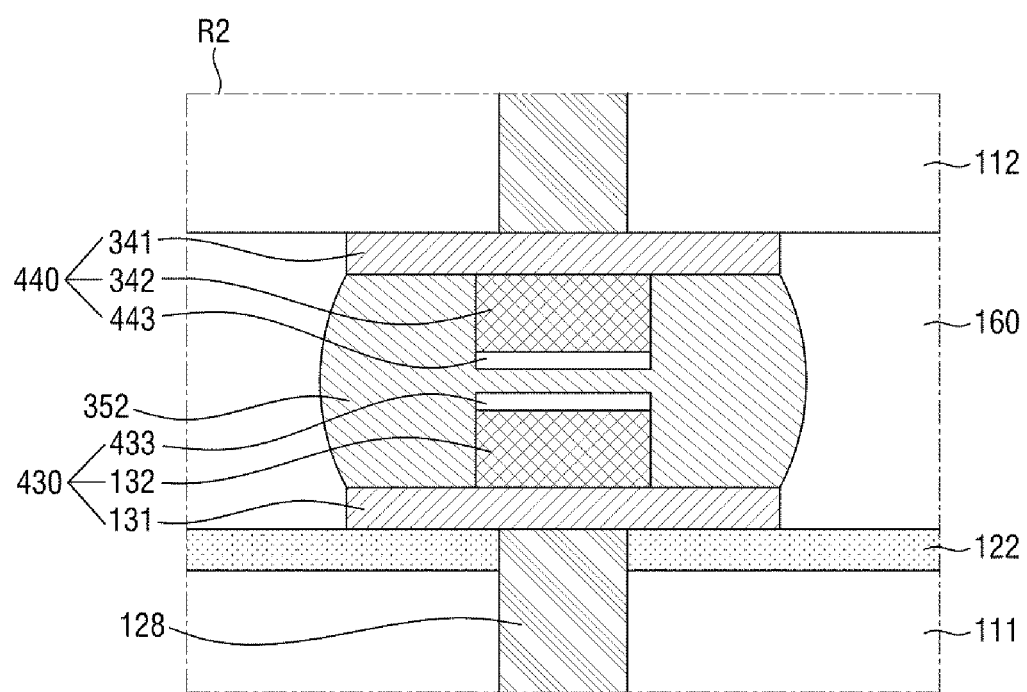
FIG. 7 illustrates an enlarged view of a semiconductor package according to still other embodiments of the inventive concepts.
Figure 7:
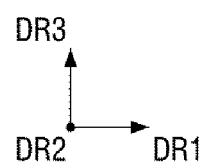

FIG. 7 illustrates an enlarged view of a semiconductor package according to still other embodiments of the inventive concepts.

Referring to FIG. 7, a first pad 430 may include the first portion 131, the second portion 132, and a first metal layer 433, and a second pad 440 may include the first portion 341, the second portion 342, and a second metal layer 443.

The first metal layer 433 may be disposed on the top surface of the second portion 132 of the first pad 430. For example, the width of the first metal layer 433 in the first horizontal direction DR1 may be the same as the width W2 (see FIG. 6) of the second portion 132 of the first pad 430 in the first horizontal direction DR1.

The second metal layer 443 may be disposed on the bottom surface of the second portion 342 of the second pad 440. For example, the width of the second metal layer 443 in the first horizontal direction DR1 may be the same as the width W7 (see FIG. 6) of the second portion 342 of the second pad 440 in the first horizontal direction DR1.

Each of the first metal layer 433 and the second metal layer 443 may include a metal. Each of the first metal layer 433 and the second metal layer 443 may include, for example, copper (Cu) or gold (Au).

Hereinafter, a semiconductor package according to still other embodiments of the inventive concepts will be described with reference to FIGS. 8 and 9. The following description will focus on differences between the semiconductor package of FIGS. 8 and 9 and the semiconductor package illustrated in FIGS. 1 to 3, and description of like elements and configurations may be omitted.

Figure 8:
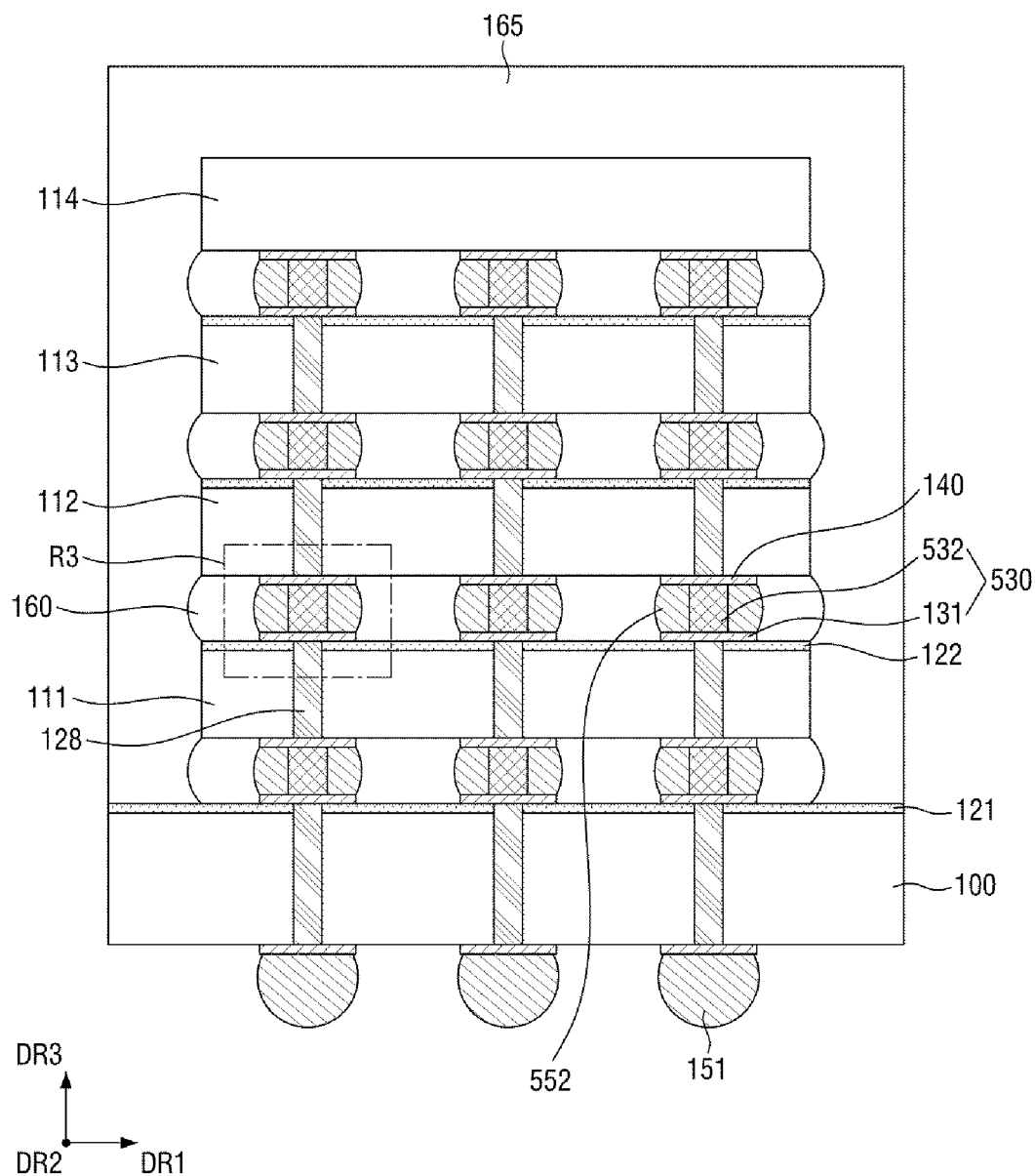
FIG. 8 illustrates a semiconductor package according to still other embodiments of the inventive concepts.

FIG. 8 illustrates a semiconductor package according to still other embodiments of the inventive concepts. FIG. 9 illustrates an enlarged view of area R3 of FIG. 8.

Figure 9:
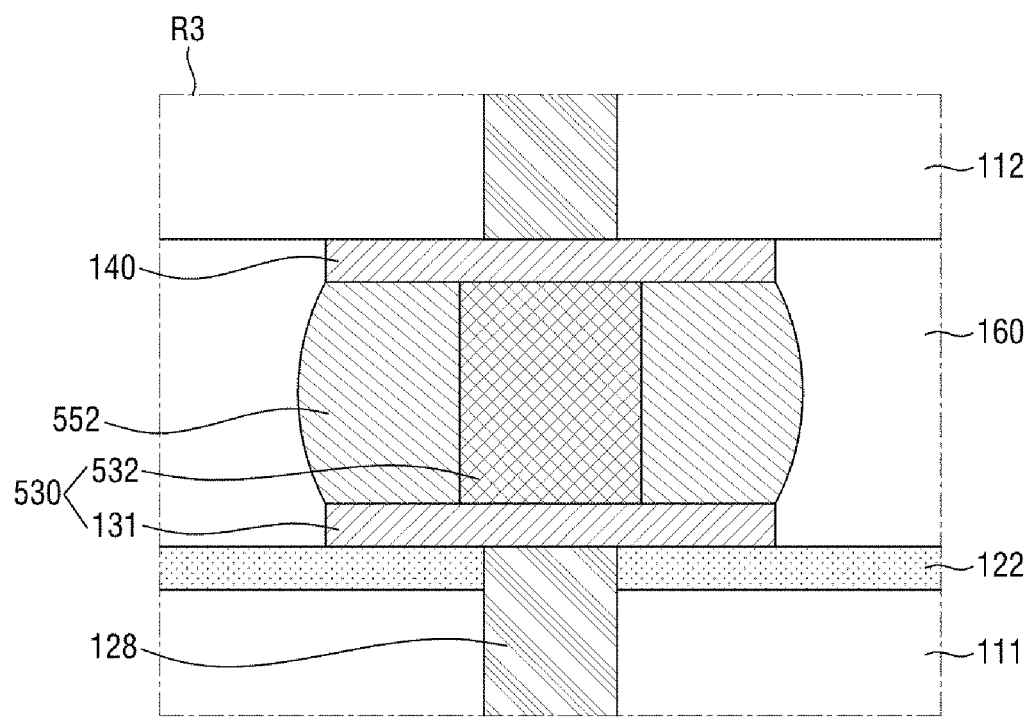
FIG. 9 illustrates an enlarged view of area R3 of FIG. 8.
Figure 9:
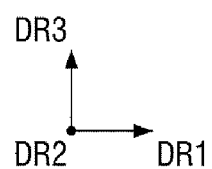

Referring to FIGS. 8 and 9, a first pad 530 and the second pad 140 may directly contact each other.

The first pad 530 may include the first portion 131 and a second portion 532 protruding from the first portion 131 in the vertical direction DR3. The second portion 532 of the first pad 530 may extend to the bottom surface of the second pad 140. That is, the second portion 532 of the first pad 530 may contact the bottom surface of the second pad 140.

A second solder ball 552 may contact the top surface of the first portion 131 of the first pad 530 and the bottom surface of the second pad 140. The second solder ball 552 may surround the sidewall of the second portion 532 of the first pad 530.

Hereinafter, a semiconductor package according to still other embodiments of the inventive concepts will be described with reference to FIG. 10. The following description will focus on differences between the semiconductor package of FIG. 10 and the semiconductor package illustrated in FIGS. 8 and 9, and description of like elements and configurations may be omitted.

Figure 10:
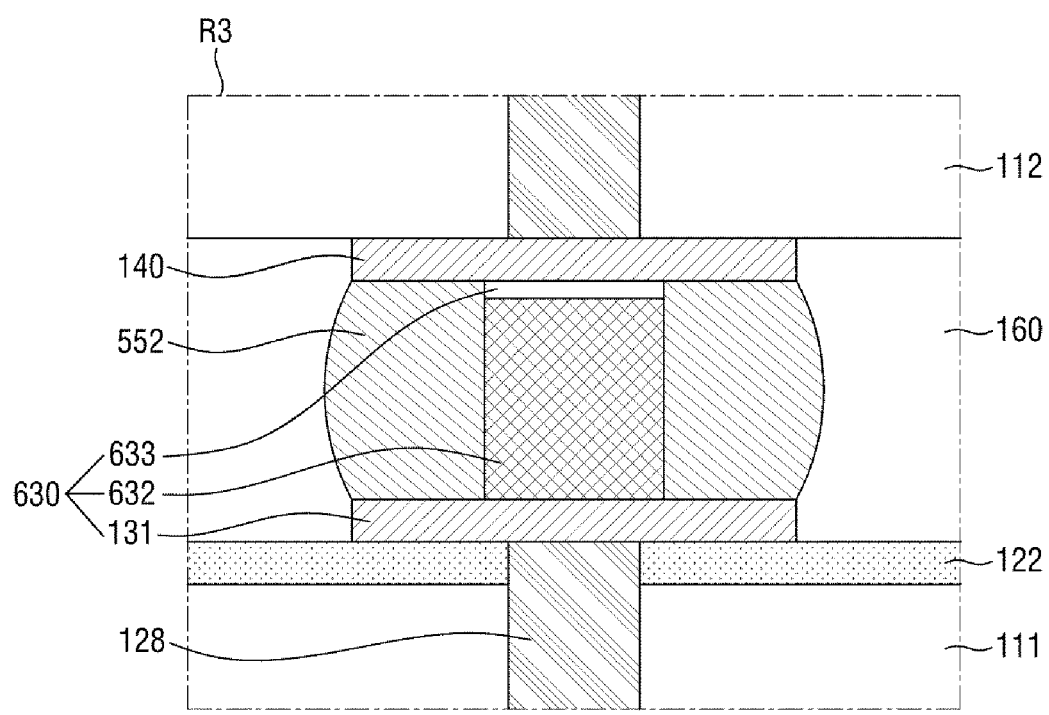
FIG. 10 illustrates an enlarged view of a semiconductor package according to still other embodiments of the inventive concepts.

FIG. 10 illustrates an enlarged view of a semiconductor package according to still other embodiments of the inventive concepts.

Referring to FIG. 10, a first pad 630 may include the first portion 131, a second portion 632, and a first metal layer 633.

The first metal layer 633 may be disposed on the top surface of the second portion 632 of the first pad 630. The first metal layer 633 may contact the top surface of the second portion 632 of the first pad 630 and the bottom surface of the second pad 140.

For example, the width of the first metal layer 633 in the first horizontal direction DR1 may be the same as the width of the second portion 632 of the first pad 630 in the first horizontal direction DR1. The first metal layer 633 may include a metal. The first metal layer 633 may include, for example, copper (Cu) or gold (Au).

Hereinafter, a semiconductor package according to still other embodiments of the inventive concepts will be described with reference to FIG. 11. The following description will focus on differences between the semiconductor package of FIG. 11 and the semiconductor package illustrated in FIGS. 8 and 9, and description of like elements and configurations may be omitted.

Figure 11:
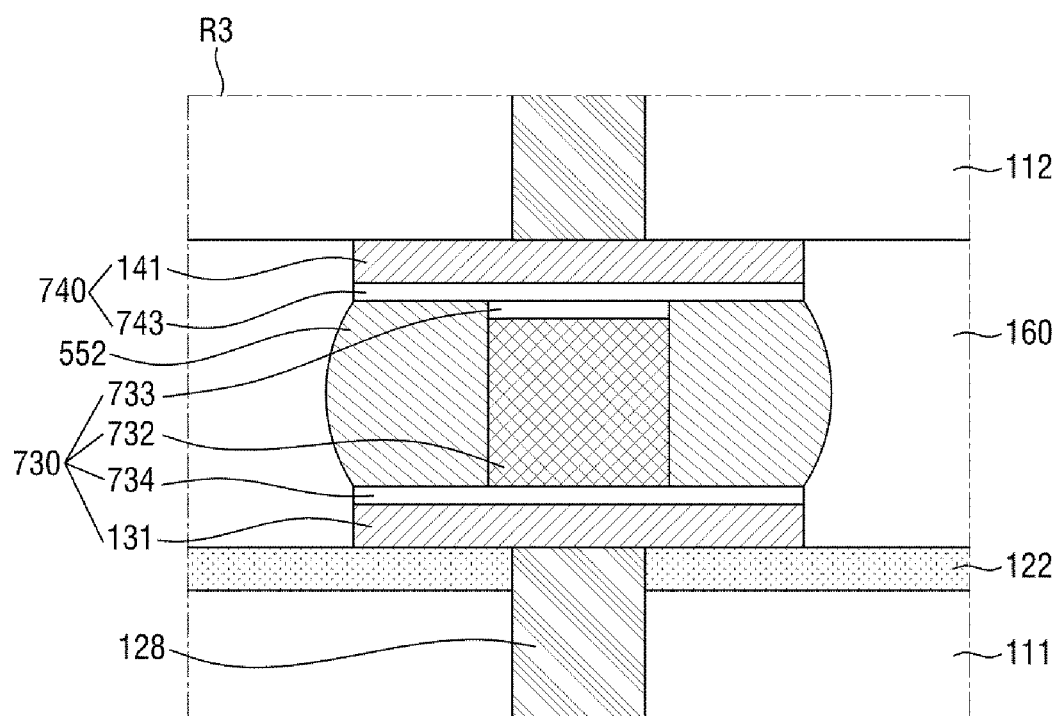
FIG. 11 illustrates an enlarged view of a semiconductor package according to still other embodiments of the inventive concepts.
Figure 11:
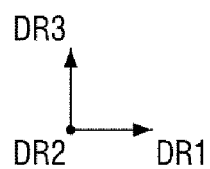

FIG. 11 illustrates an enlarged view of a semiconductor package according to still other embodiments of the inventive concepts.

Referring to FIG. 11, a first pad 730 may include the first portion 131, a second portion 732, a first metal layer 733, and a second metal layer 734. In addition, a second pad 740 may include a first portion 141 and a third metal layer 743.

The second metal layer 734 may be disposed on the top surface of the first portion 131 of the first pad 730. The width of the second metal layer 734 in the first horizontal direction DR1 may be the same as the width of the first portion 131 of the first pad 730 in the first horizontal direction DR1.

The second portion 732 of the first pad 730 may be disposed to protrude from the second metal layer 734 in the vertical direction DR3. The first metal layer 733 may be disposed on the top surface of the second portion 732 of the first pad 730. The width of the first metal layer 733 in the first horizontal direction DR1 may be the same as the width of the second portion 732 of the first pad 730 in the first horizontal direction DR1.

The third metal layer 743 may be disposed on the bottom surface of the first portion 141 of the second pad 740. The width of the third metal layer 743 in the first horizontal direction DR1 may be the same as the width of the first portion 141 of the second pad 740 in the first horizontal direction DR1. The third metal layer 743 may contact the first metal layer 733.

Each of the first to third metal layers 733, 734, and 743 may include a metal. Each of the first to third metal layers 733, 734, and 743 may include, for example, copper (Cu) or gold (Au).

Hereinafter, a semiconductor package according to still other embodiments of the inventive concepts will be described with reference to FIGS. 12 and 13. The following description will focus on differences between the semiconductor package of FIGS. 12 and 13 and the semiconductor package illustrated in FIGS. 8 and 9, and description of like elements and configurations may be omitted.

Figure 12:
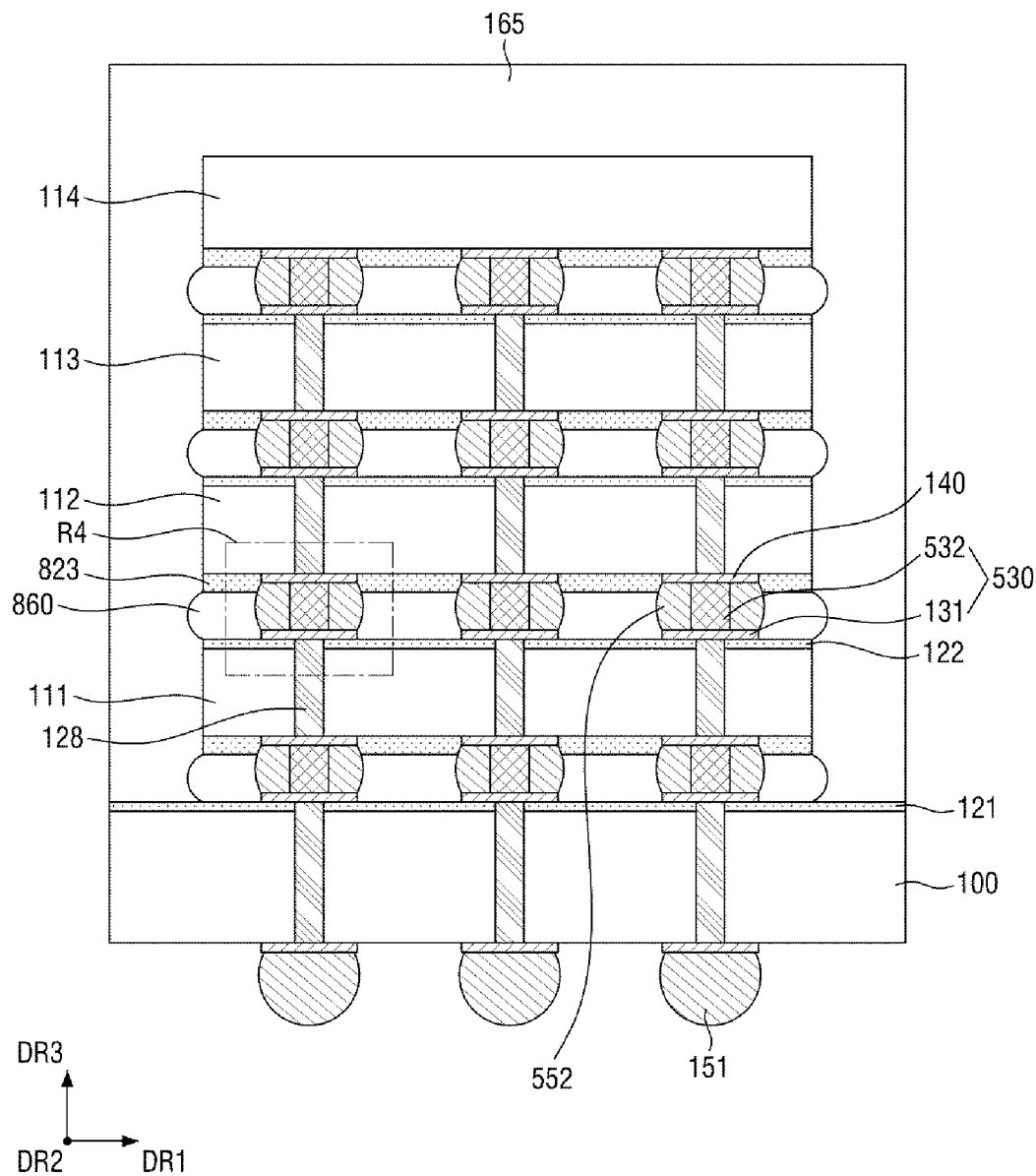
FIG. 12 illustrates a semiconductor package according to still other embodiments of the inventive concepts.

FIG. 12 illustrates a semiconductor package according to still other embodiments of the inventive concepts. FIG. 13 illustrates an enlarged view of area R4 of FIG. 12.

Figure 13:
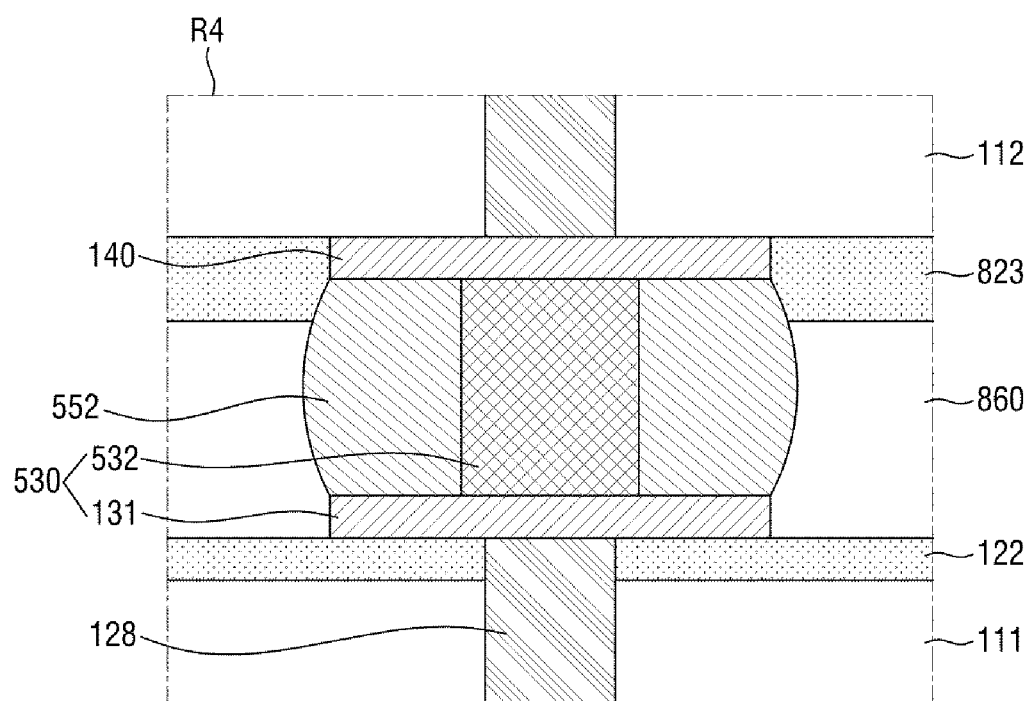
FIG. 13 illustrates an enlarged view of area R4 of FIG. 12.

Referring to FIGS. 12 and 13, the semiconductor package may include a third insulating layer 823 disposed on the bottom surface of each of the second to fifth semiconductor chips 111, 112, 113 and 114.

For example, the third insulating layer 823 may be disposed on the bottom surface of the third semiconductor chip 112. The third insulating layer 823 may surround the sidewall of the second pad 140. The third insulating layer 823 may surround at least a portion of the sidewall of the second solder ball 552. However, in some other embodiments the third insulating layer 823 may not be in contact with the second solder ball 552. The third insulating layer 823 may include an insulating material.

The third insulating layer 823 disposed on the bottom surface of each of the second semiconductor chip 111, the fourth semiconductor chip 113, and the fifth semiconductor chip 114 may have a structure similar to that of the third insulating layer 823 disposed on the bottom surface of the third semiconductor chip 112.

Adhesive layers 860 may be disposed between the third insulating layer 823 and the top surface of each of the first to fourth semiconductor chips 100, 111, 112, and 113.

Hereinafter, a semiconductor package according to still other embodiments of the inventive concepts will be described with reference to FIGS. 14 and 15. The following description will focus on differences between the semiconductor package of FIGS. 14 and 15 and the semiconductor package illustrated in FIGS. 8 and 9, and description of like elements and configurations may be omitted.

Figure 14:
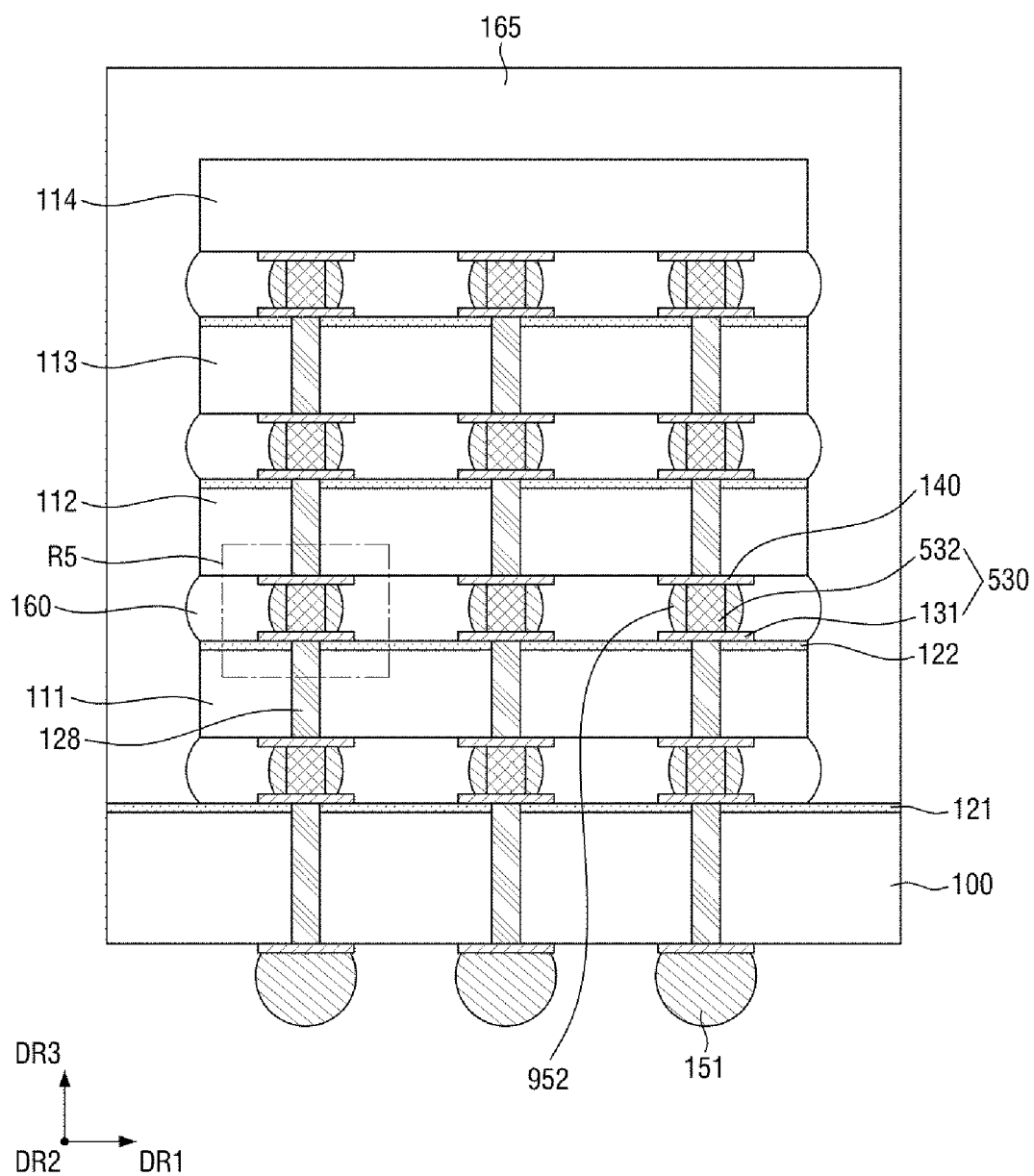
FIG. 14 illustrates a semiconductor package according to still other embodiments of the inventive concepts.

FIG. 14 illustrates a semiconductor package according to still other embodiments of the inventive concepts. FIG. 15 illustrates an enlarged view of area R5 of FIG. 14.

Figure 15:
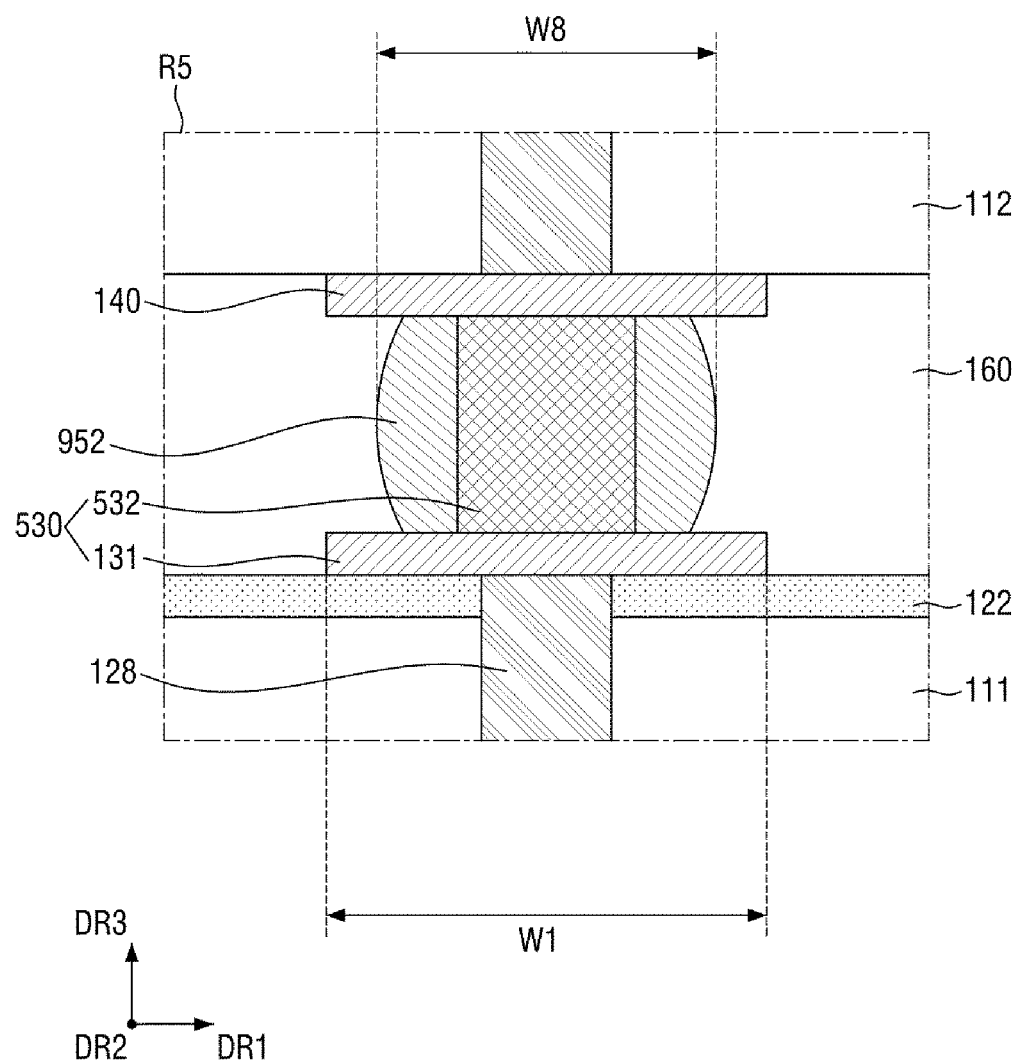
FIG. 15 illustrates an enlarged view of area R5 of FIG. 14.

Referring to FIGS. 14 and 15, the width of a second solder ball 952 may be smaller than the width of the first portion 131 of the first pad 530.

For simplicity of description, the second semiconductor chip 111 is defined as a first structure, and the third semiconductor chip 112 is defined as a second structure.

For example, the second solder ball 952 may be disposed between the second semiconductor chip 111, which is may be characterized as the first structure, and the third semiconductor chip 112, which may be characterized as the second structure. Specifically, the second solder ball 952 may be disposed between the first portion 131 of the first pad 530 provided on the top surface of the second semiconductor chip 111 and the second pad 140 provided on the bottom surface of the third semiconductor chip 112.

The second portion 532 of the first pad 530 may connect between the first portion 131 of the first pad 530 and the second pad 140. The second solder ball 952 may surround the sidewall of the second portion 532 of the first pad 530, between the first portion 131 of the first pad 530 and the second pad 140.

A width W8 of the second solder ball 952 in the first horizontal direction DR1 may be smaller than the width W1 of the first portion 131 of the first pad 530 in the first horizontal direction DR1. In addition, the width W8 of the second solder ball 952 in the first horizontal direction DR1 may be smaller than the width of the second pad 140 in the first horizontal direction DR1. Accordingly, at least a portion of the top surface of the first portion 131 of the first pad 530 may contact the adhesive layer 160. In addition, at least a portion of the bottom surface of the second pad 140 may contact the adhesive layer 160.

Hereinafter, a semiconductor package according to still other embodiments of the inventive concepts will be described with reference to FIGS. 16 to 18. The following description will focus on differences between the semiconductor package of FIGS. 16 to 18 and the semiconductor package illustrated in FIGS. 8 and 9, and description of like elements and configurations may be omitted.

Figure 16:
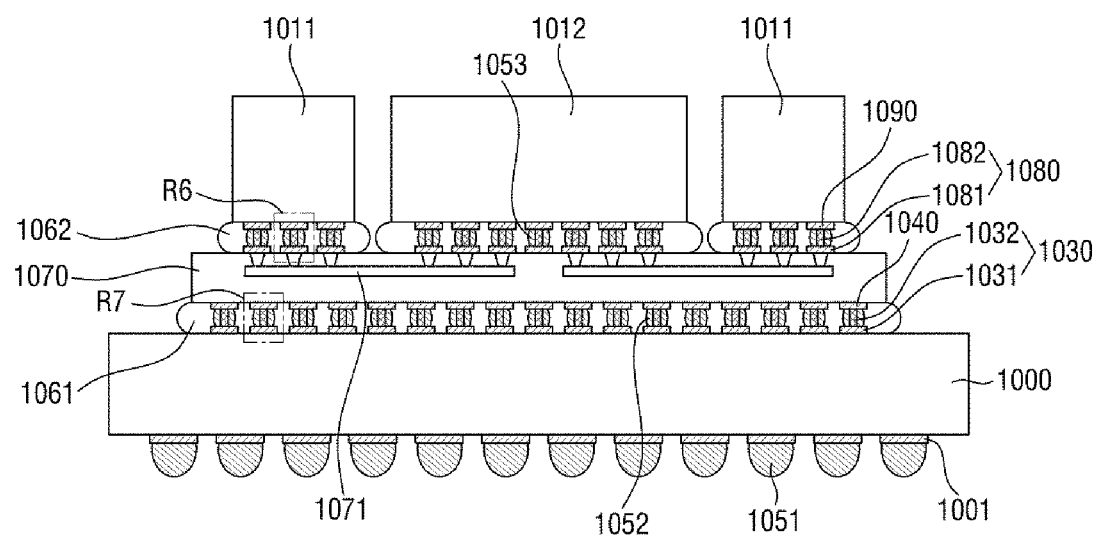
FIG. 16 illustrates a semiconductor package according to still other embodiments of the inventive concepts.

FIG. 16 illustrates a semiconductor package according to still other embodiments of the inventive concepts. FIG. 17 illustrates an enlarged view of area R6 of FIG. 16. FIG. 18 illustrates an enlarged view of area R7 of FIG. 15.

Figure 17:
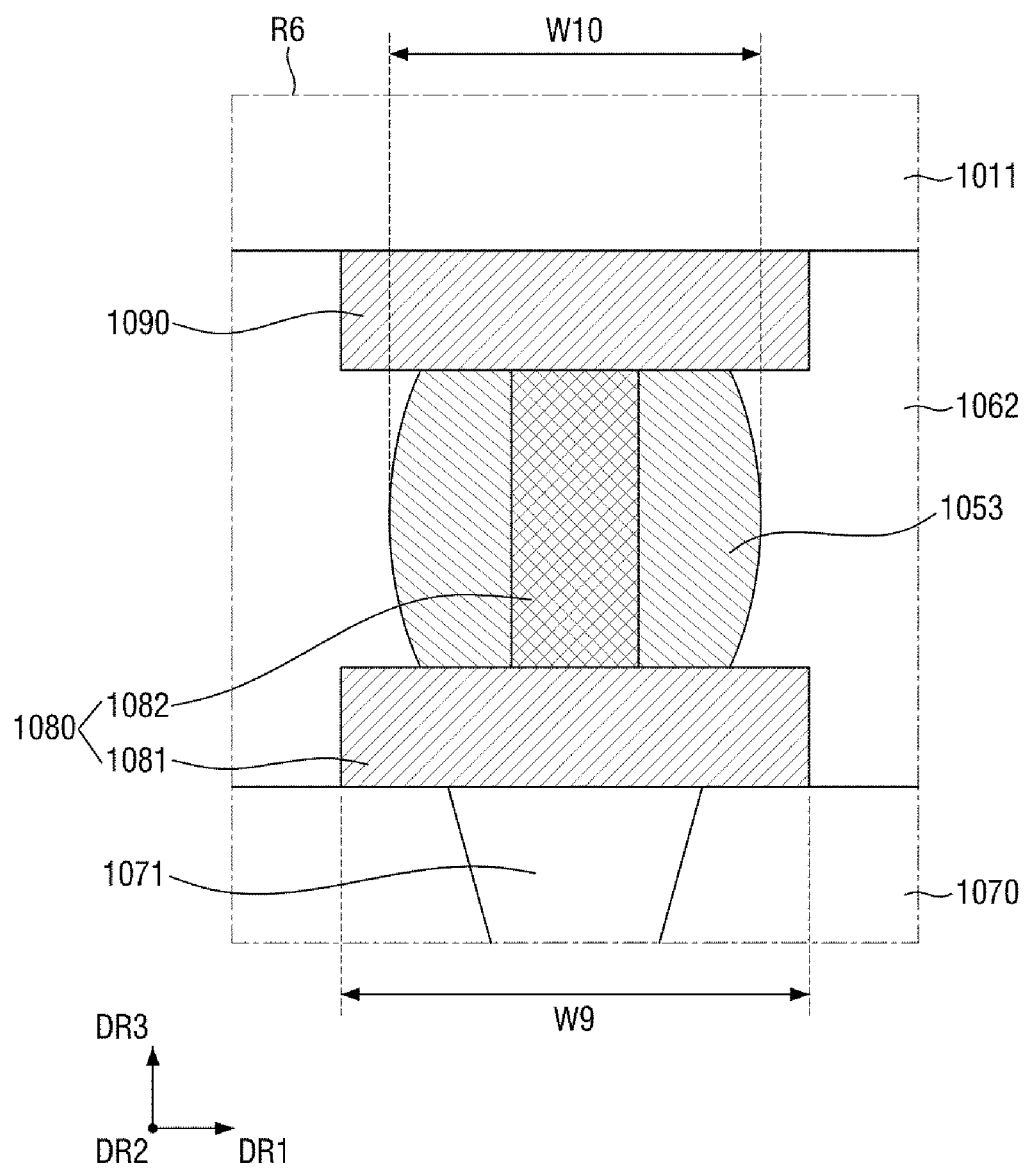
FIG. 17 illustrates an enlarged view of area R6 of FIG. 16.
Figure 18:
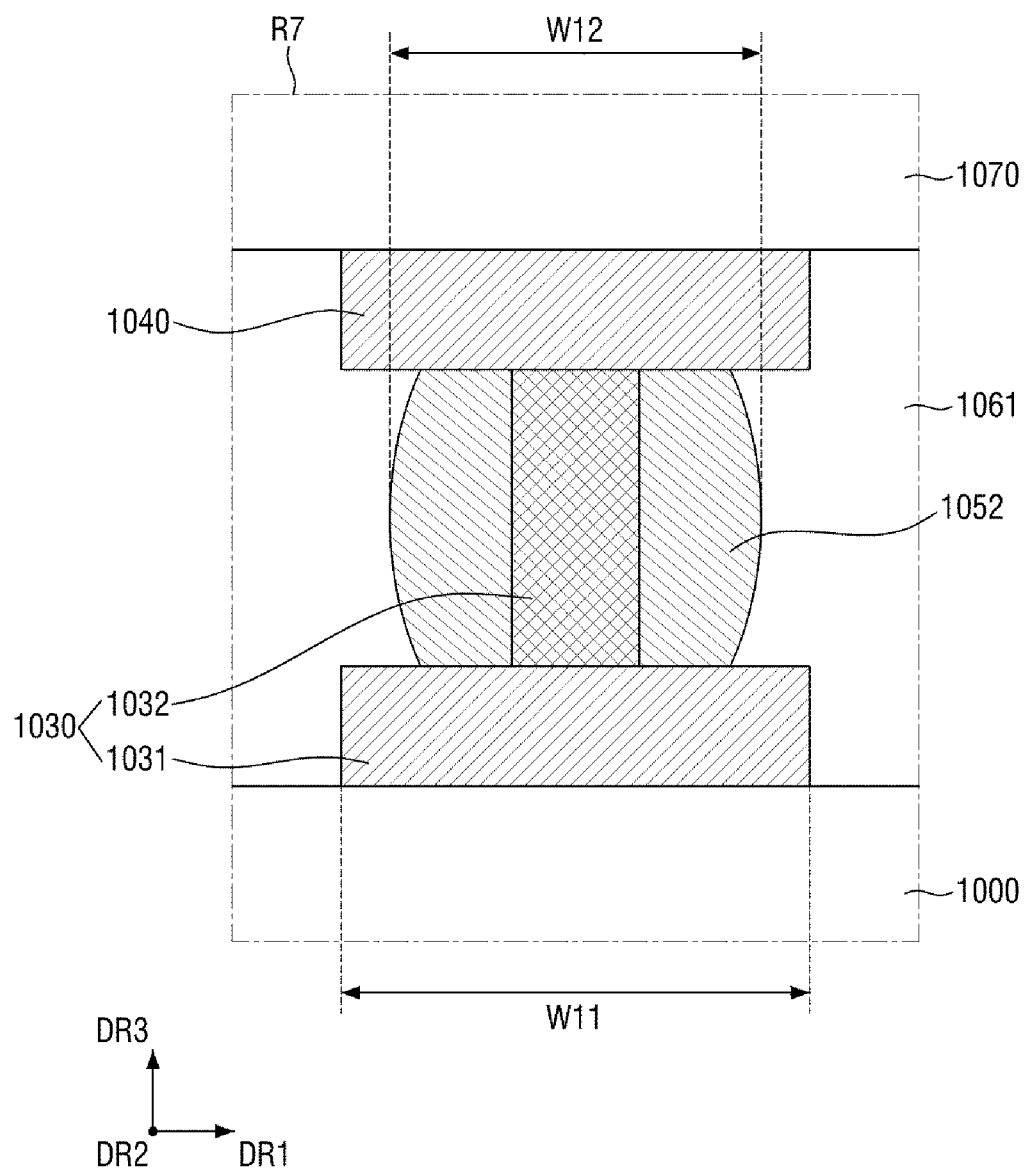
FIG. 18 illustrates an enlarged view of area R7 of FIG. 16.

Referring to FIGS. 16 to 18, the semiconductor package may include a substrate 1000, a first semiconductor chip 1011, a second semiconductor chip 1012, first to fifth pads 1030, 1040, 1080, 1090, and 1001, first to third solder balls 1051, 1052, and 1053, a first adhesive layer 1061, a second adhesive layer 1062, and an interposer 1070. Of note, a first semiconductor chip 1011 is shown as next to a first side of second semiconductor chip 1012 along the first horizontal direction DR1, and another first semiconductor chip 1011 is shown as next to a second side of second semiconductor chip 1012 along the first horizontal direction DR1.

For simplicity of description, the substrate 1000 is defined as a first structure, the interposer 1070 is defined as a second structure, and the first semiconductor chip(s) 1011 and the second semiconductor chip 1012 are defined as a third structure.

The substrate 1000, which is the first structure, may be, for example, a printed circuit board (PCB) or a ceramic substrate. However, in other embodiments the substrate 1000 may be other materials.

The fifth pad 1001 may be disposed on the bottom surface of the substrate 1000. The first solder ball 1051 may be disposed to protrude from the fifth pad 1001.

The interposer 1070, which is the second structure, may be disposed above the top surface of the substrate 1000. The interposer 1070 may be, for example, a printed circuit board (PCB) or a ceramic substrate. However, in some other embodiments the interposer 1070 may be an interposer including silicon.

A wiring layer 1071 may be disposed inside the interposer 1070. The wiring layer 1071 may include a plurality of wirings and a plurality of vias connecting the wirings to each other.

The first pad 1030, the second pad 1040, the second solder ball 1052, and the first adhesive layer 1061 may be disposed between the substrate 1000 and the interposer 1070.

The first pad 1030 may be disposed on the top surface of the substrate 1000. The first pad 1030 may include a first portion 1031 in contact with the top surface of the substrate 1000, and a second portion 1032 protruding from the first portion 1031 in the vertical direction DR3. The second portion 1032 of the first pad 1030 may contact the second pad 1040.

The second pad 1040 may be disposed on the bottom surface of the interposer 1070. The top surface of the second pad 1040 may contact the interposer 1070.

As shown in FIG. 18 for example, the width of the second portion 1032 of the first pad 1030 in the first horizontal direction DR1 may be smaller than a width W11 of the first portion 1031 of the first pad 1030 in the first horizontal direction DR1. In addition, the width of the second portion 1032 of the first pad 1030 in the first horizontal direction DR1 may be smaller than the width of the second pad 1040 in the first horizontal direction DR1.

The second solder ball 1052 may be disposed between the first portion 1031 of the first pad 1030 and the second pad 1040. The second solder ball 1052 may surround the sidewall of the second portion 1032 of the first pad 1030.

A width W12 of the second solder ball 1052 in the first horizontal direction DR1 may be smaller than the width W11 of the first portion 1031 of the first pad 1030 in the first horizontal direction DR1. In addition, the width W12 of the second solder ball 1052 in the first horizontal direction DR1 may be smaller than the width of the second pad 1040 in the first horizontal direction DR1.

The first adhesive layer 1061 may surround the sidewall of the first portion 1031 of the first pad 1030, the sidewall of the second pad 1040, and the sidewall of the second solder ball 1052, between the substrate 1000 and the interposer 1070.

The first semiconductor chip(s) 1011 and the second semiconductor chip 1012, which are the third structure, may be disposed above the top surface of the interposer 1070. For example, the second semiconductor chip 1012 may be spaced apart from the first semiconductor chip(s) 1011 in the first horizontal direction DR1. In FIG. 16, the second semiconductor chip 1012 is shown to be disposed between two first semiconductor chips 1011, but this is merely for simplicity of description, and the inventive concepts is not limited thereto. For example, the semiconductor package may include a single first semiconductor chip 1011, or any number of first semiconductor chips 1011.

The first semiconductor chip 1011 may be, for example, a memory package including a plurality of memory semiconductor chips. The second semiconductor chip 1012 may be, for example, a logic semiconductor chip. The second semiconductor chip 1012 may be a micro-processor. The second semiconductor chip 1012 may be, for example, a central processing unit (CPU), a controller, an application specific integrated circuit (ASIC), or the like.

Each of the first semiconductor chip(s) 1011 and the second semiconductor chip 1012 may be electrically connected to the interposer 1070. The first semiconductor chip(s) 1011 may be electrically connected to the second semiconductor chip 1012 through the wiring layer 1071 disposed inside the interposer 1070.

The third pad 1080, the fourth pad 1090, the third solder ball 1053, and the second adhesive layer 1062 may be disposed between the interposer 1070 and the first semiconductor chip(s) 1011, and between the interposer 1070 and the semiconductor chip 1012.

The third pad 1080 may be disposed on the top surface of the interposer 1070. The third pad 1080 may include a first portion 1081 in contact with the top surface of the interposer 1070 and a second portion 1082 protruding from the first portion 1081 in the vertical direction DR3. The first portion 1081 of the third pad 1080 may be connected to the wiring layer 1071 disposed inside the interposer 1070. The second portion 1082 of the third pad 1080 may contact the fourth pad 1090.

The fourth pad 1090 may be disposed on the bottom surface of the first or second semiconductor chips 1011 and 1012. The top surface of the fourth pad 1090 may contact the first or second semiconductor chips 1011 and 1012.

As shown in FIG. 17 for example, the width of the second portion 1082 of the third pad 1080 in the first horizontal direction DR1 may be smaller than a width W9 of the first portion 1081 of the third pad 1080 in the first horizontal direction DR1. In addition, the width of the second portion 1082 of the third pad 1080 in the first horizontal direction DR1 may be smaller than the width of the fourth pad 1090 in the first horizontal direction DR1.

The third solder ball 1053 may be disposed between the first portion 1081 of the third pad 1080 and the fourth pad 1090. The third solder ball 1053 may surround the sidewall of the second portion 1082 of the third pad 1080.

A width W10 of the third solder ball 1053 in the first horizontal direction DR1 may be smaller than the width W9 of the first portion 1081 of the third pad 1080 in the first horizontal direction DR1. In addition, the width W10 of the third solder ball 1053 in the first horizontal direction DR1 may be smaller than the width of the fourth pad 1090 in the first horizontal direction DR1.

The second adhesive layer 1062 may be disposed between the interposer 1070 and the first semiconductor chip 1011, and between the interposer 1070 and the second semiconductor chip 1012. The second adhesive layer 1062 may surround the sidewall of the first portion 1081 of the third pad 1080, the sidewall of the fourth pad 1090, and the sidewall of the third solder ball 1053.

Hereinafter, a semiconductor package according to still other embodiments of the inventive concepts will be described with reference to FIGS. 19 to 21. The following description will focus on differences between the semiconductor package of FIGS. 19 to 21 and the semiconductor package illustrated in FIGS. 8 and 9, and description of like elements and configurations may be omitted.

Figure 19:
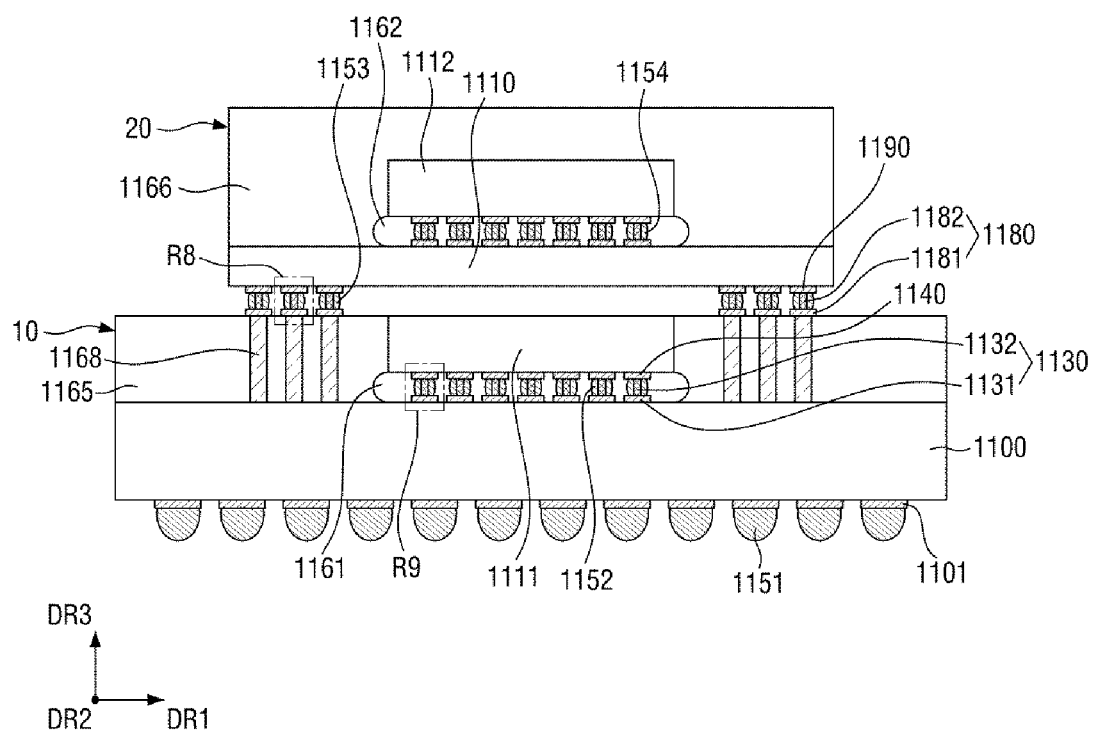
FIG. 19 illustrates a semiconductor package according to still other embodiments of the inventive concepts.

FIG. 19 illustrates a semiconductor package according to still other embodiments of the inventive concepts. FIG. 20 illustrates an enlarged view of area R8 of FIG. 19. FIG. 21 illustrates an enlarged view of area R9 of FIG. 19.

Figure 20:
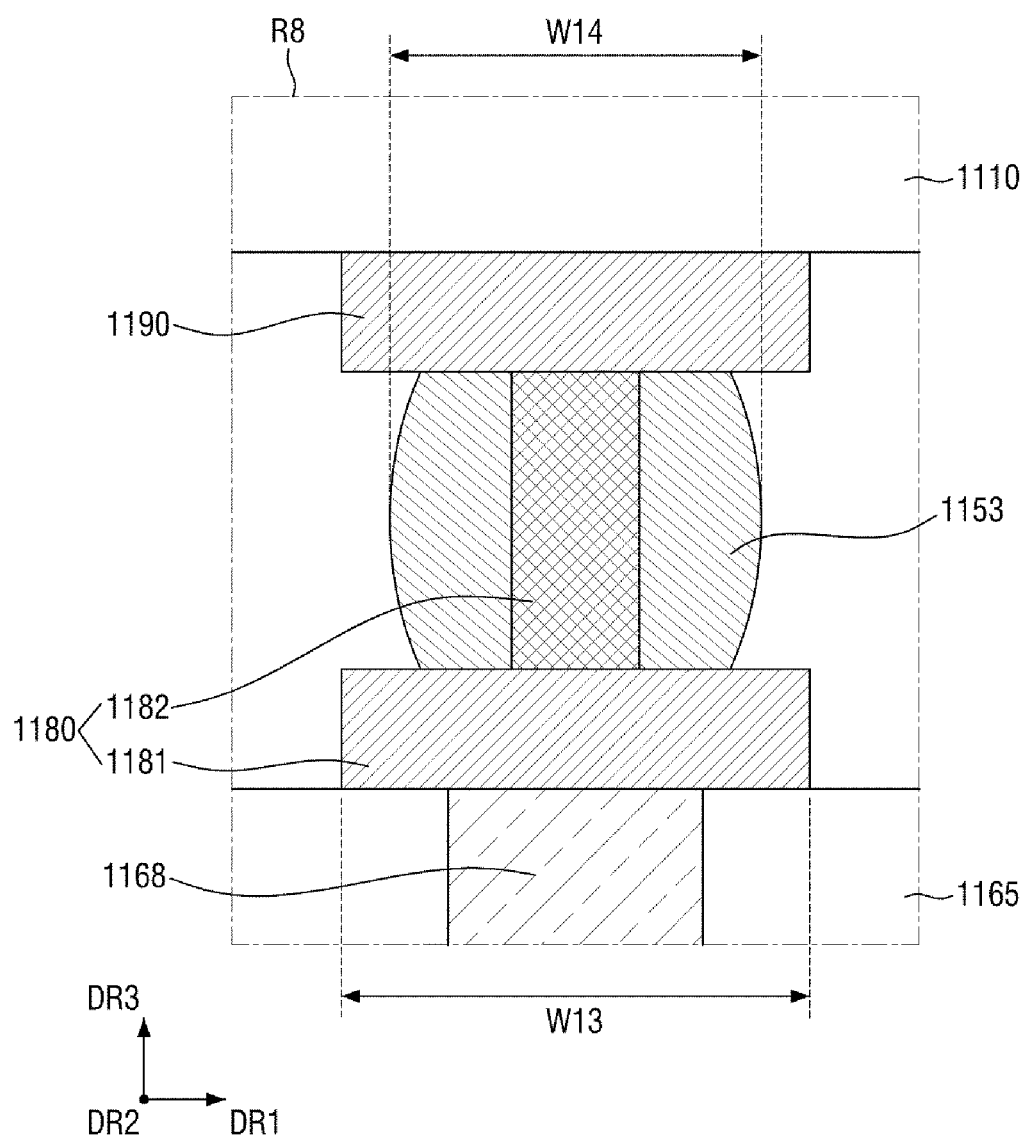
FIG. 20 illustrates an enlarged view of area R8 of FIG. 19.
Figure 21:
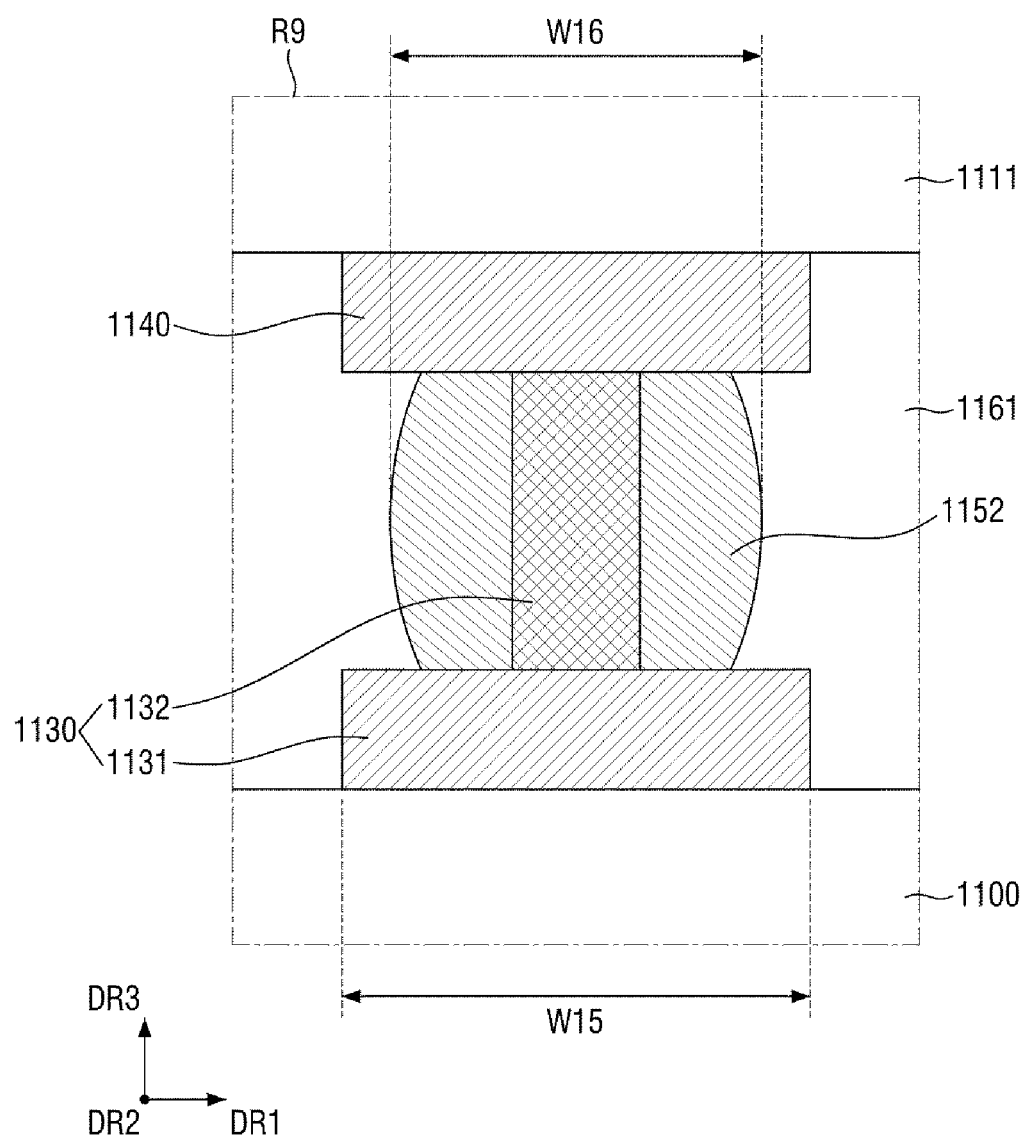
FIG. 21 illustrates an enlarged view of area R9 of FIG. 19.

Referring to FIGS. 19 to 21, the semiconductor package may include a first package 10, and a second package 20 disposed on the first package 10.

For simplicity of description, the first package 10 is defined as a first structure, the second package 20 is defined as a second structure, a first substrate 1100 is defined as a third structure, and a first semiconductor chip 1111 is defined as a fourth structure.

The first package 10, which is the first structure, may include the first substrate 1100, the first semiconductor chip 1111, a first pad 1130, a second pad 1140, a fifth pad 1101, and a first solder ball 1151, a second solder ball 1152, a first adhesive layer 1161, a first mold layer 1165, and a through via 1168.

The first substrate 1100, which is the third structure, may be, for example, a printed circuit board (PCB) or a ceramic substrate. However, in other embodiments the first substrate 1100 may be made of other materials.

The fifth pad 1101 may be disposed on the bottom surface of the first substrate 1100. The first solder ball 1151 may be disposed to protrude from the fifth pad 1101.

The first semiconductor chip 1111, which is the fourth structure, may be disposed on the first substrate 1100. In some embodiments, the first semiconductor chip 1111 may include one semiconductor chip. In some other embodiments, the first semiconductor chip 1111 may be a package that includes a plurality of semiconductor chips.

The first pad 1130, the second pad 1140, the second solder ball 1152, and the first adhesive layer 1161 may be disposed between the first substrate 1100 and the first semiconductor chip 1111.

The first pad 1130 may be disposed on the top surface of the first substrate 1100. The first pad 1130 may include a first portion 1131 in contact with the top surface of the first substrate 1100 and a second portion 1132 protruding from the first portion 1131 in the vertical direction DR3. The second portion 1132 of the first pad 1130 may contact the second pad 1140.

The second pad 1140 may be disposed on the bottom surface of the first semiconductor chip 1111. The top surface of the second pad 1140 may contact the first semiconductor chip 1111.

As shown in FIG. 21 for example, the width of the second portion 1132 of the first pad 1130 in the first horizontal direction DR1 may be smaller than a width W15 of the first portion 1131 of the first pad 1130 in the first horizontal direction DR1. In addition, the width of the second portion 1132 of the first pad 1130 in the first horizontal direction DR1 may be smaller than the width of the second pad 1140 in the first horizontal direction DR1.

The second solder ball 1152 may be disposed between the first portion 1131 of the first pad 1130 and the second pad 1140. The second solder ball 1152 may surround the sidewall of the second portion 1132 of the first pad 1130.

A width W16 of the second solder ball 1152 in the first horizontal direction DR1 may be smaller than the width W15 of the first portion 1131 of the first pad 1130 in the first horizontal direction DR1. In addition, the width W16 of the second solder ball 1152 in the first horizontal direction DR1 may be smaller than the width of the second pad 1140 in the first horizontal direction DR1.

The first adhesive layer 1161 may surround the sidewall of the first portion 1131 of the first pad 1130, the sidewall of the second pad 1140, and the sidewall of the solder ball 1152, between the first substrate 1100 and the first semiconductor chip 1111.

The first mold layer 1165 may be disposed on the top surface of the first substrate 1100. The first mold layer 1165 may surround the sidewall of the first semiconductor chip 1111 and the sidewall of the first adhesive layer 1161. In FIG. 19, it is shown that the top surface of the first mold layer 1165 is formed on the same plane as the top surface of the first semiconductor chip 1111, but in some other embodiments the first mold layer 1165 may cover the top surface of the first semiconductor chip 1111.

The first mold layer 1165 may include, for example, an epoxy molding compound (EMC) or two or more types of silicon hybrid materials.

The through via 1168 may penetrate through the first mold layer 1165 in the vertical direction DR3 at or near the sidewall of the first semiconductor chip 1111. The through via 1168 may extend from the top surface of the first substrate 1100 to the top surface of the first mold layer 1165.

The second package 20, which is the second structure, may be disposed above the first package 10. The second package 20 may include a second substrate 1110, a second semiconductor chip 1112, a first pad similar to the first pad 1130, a second pad similar to the second pad 1140, a fourth solder ball 154, a second adhesive layer 1162, and a second mold layer 1166.

The second substrate 1110 may be, for example, a printed circuit board (PCB) or a ceramic substrate. However, in other embodiments the second substrate 1110 may be made of other materials.

The second semiconductor chip 1112 may be disposed above the second substrate 1110. In some embodiments, the second semiconductor chip 1112 may include one semiconductor chip. In some other embodiments, the second semiconductor chip 1112 may be a package that includes a plurality of semiconductor chips.

The above described first pad, second pad, the fourth solder ball 1154, and the second adhesive layer 1162 disposed between the second substrate 1110 and the second semiconductor chip 1112 may have a structure similar to the first pad 1130, the second pad 1140, the second solder ball 1152, and the first adhesive layer 1161 disposed between the first substrate 1100 and the first semiconductor chip 1111.

The second mold layer 1166 may be disposed on the top surface of the second substrate 1110. The second mold layer 1166 may surround the sidewall of the second semiconductor chip 1112 and the sidewall of the second adhesive layer 1162. In FIG. 19, it is shown that the top surface of the second mold layer 1166 covers the top surface of the second semiconductor chip 1112, but in some other embodiments the top surface of the second mold layer 1166 may be formed on the same plane as the top surface of the second semiconductor chip 1112.

A third pad 1180, a fourth pad 1190, and a third solder ball 1153 may be disposed between the first package 10, which is the first structure, and the second package 20, which is the second structure.

The third pad 1180 may be disposed on the top surface of the first package 10. The third pad 1180 may include a first portion 1181 in contact with the top surface of the first package 10 and a second portion 1182 protruding from the first portion 1181 in the vertical direction DR3. The second portion 1182 of the third pad 1180 may contact the fourth pad 1190.

The fourth pad 1190 may be disposed on the bottom surface of the second package 20. The top surface of the fourth pad 1190 may contact the second package 20.

As shown in FIG. 20 for example, the width of the second portion 1182 of the third pad 1180 in the first horizontal direction DR1 may be smaller than a width W13 of the first portion 1181 of the third pad 1180 in the first horizontal direction DR1. In addition, the width of the second portion 1182 of the third pad 1180 in the first horizontal direction DR1 may be smaller than the width of the fourth pad 1190 in the first horizontal direction DR1.

The third solder ball 1153 may be disposed between the first portion 1181 of the third pad 1180 and the fourth pad 1190. The third solder ball 1153 may surround the sidewall of the second portion 1182 of the third pad 1180.

A width W14 of the third solder ball 1153 in the first horizontal direction DR1 may be smaller than the width W13 of the first portion 1181 of the third pad 1180 in the first horizontal direction DR1. In addition, the width W14 of the third solder ball 1153 in the first horizontal direction DR1 may be smaller than the width of the fourth pad 1190 in the first horizontal direction DR1.

Hereinafter, a method of fabricating the semiconductor package shown in FIG. 1 will be described with reference to FIGS. 1 and 22 to 26.

FIGS. 22 to 26 illustrate intermediate steps explanatory of a method of fabricating the semiconductor package shown in FIG. 1.

Figure 22:
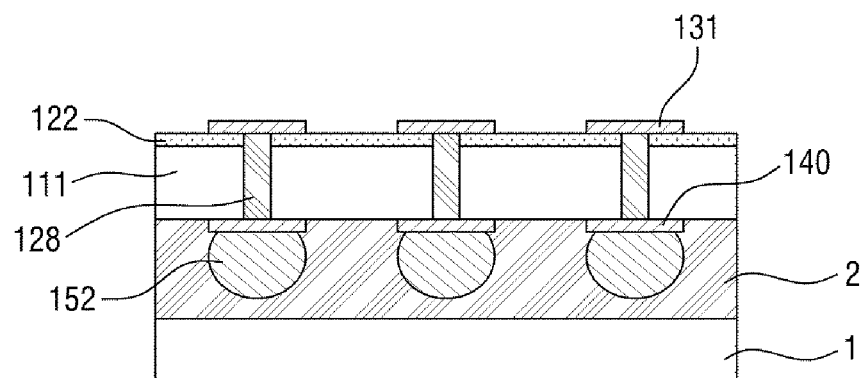
FIGS. 22, 23, 24, 25 and 26 illustrate intermediate steps explanatory of a method of fabricating the semiconductor package shown in FIG. 1 according to embodiments of the inventive concepts.
Figure 22:
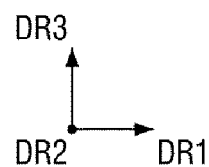

Referring to FIG. 22, the second semiconductor chip 111 including the second insulating layer 122 may be formed. Subsequently, the through via 128 penetrating the second semiconductor chip 111 is formed, and the first portion 131 of the first pad 130 (see FIG. 1) is formed on the top surface of the second semiconductor chip 111. Further, the second pad 140 is formed on the bottom surface of the second semiconductor chip 111, and the second solder ball 152 is formed in contact with the second pad 140.

Thereafter, a first release layer 2 is formed on the bottom surface of the second semiconductor chip 111 to cover the second pad 140 and the second solder ball 152. The first release layer 2 may include, for example, a photosensitive insulating material. The first release layer 2 may include, for example, epoxy or polyimide. However, in some other embodiments the first release layer 2 may be an inorganic release layer to introduce a stable detachable property.

Next, a first carrier substrate 1 is formed on the bottom surface of the first release layer 2. The first carrier substrate 1 may include, for example, silicon, metal, glass, plastic, ceramic, or the like, but is not limited thereto and may include other materials.

Figure 23:
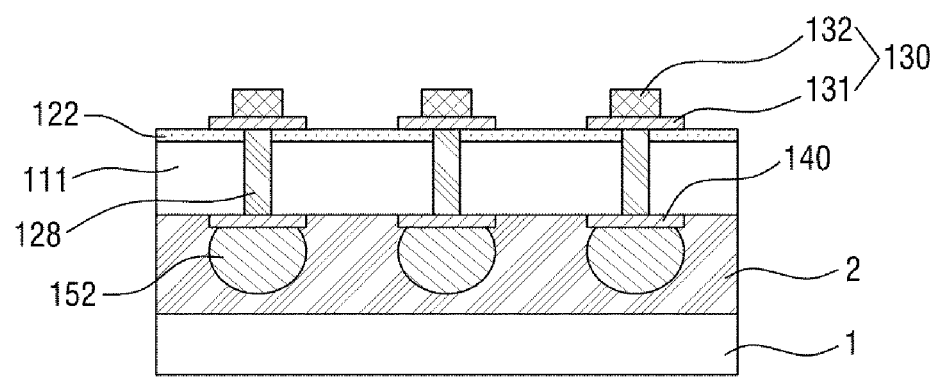

Referring to FIG. 23, the second portion 132 of the first pad 130 is formed on the first portion 131 of the first pad 130. The second portion 132 of the first pad 130 may be formed on the first portion 131 of the first pad 130 using a mask pattern. The width of the second portion 132 of the first pad 130 in the first horizontal direction DR1 may be formed to be smaller than the width of the first portion 131 of the first pad 130 in the first horizontal direction DR1.

Figure 24:
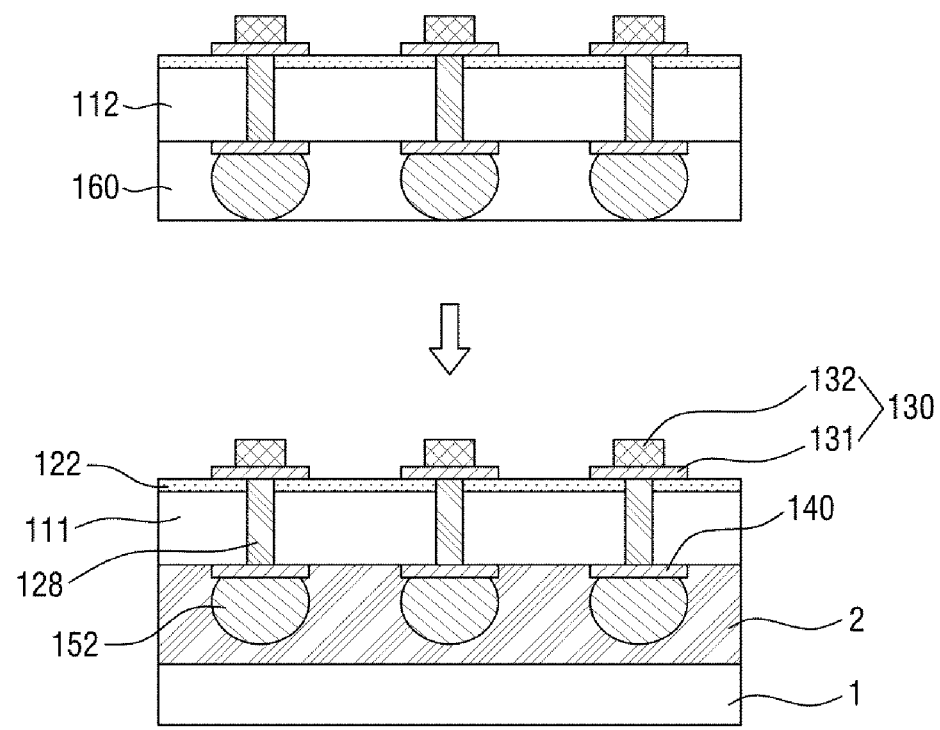

Referring to FIG. 24, similarly to the second semiconductor chip 111, a through via similar to the through via 128, a first pad similar to the first pad 130, a second pad similar to the second pad 140, and a solder ball similar to the second solder ball 152 are formed at the third semiconductor chip 112. Additionally, the adhesive layer 160 is formed on the bottom surface of the third semiconductor chip 112 to cover the second pad 140 and the second solder ball 152.

Figure 25:
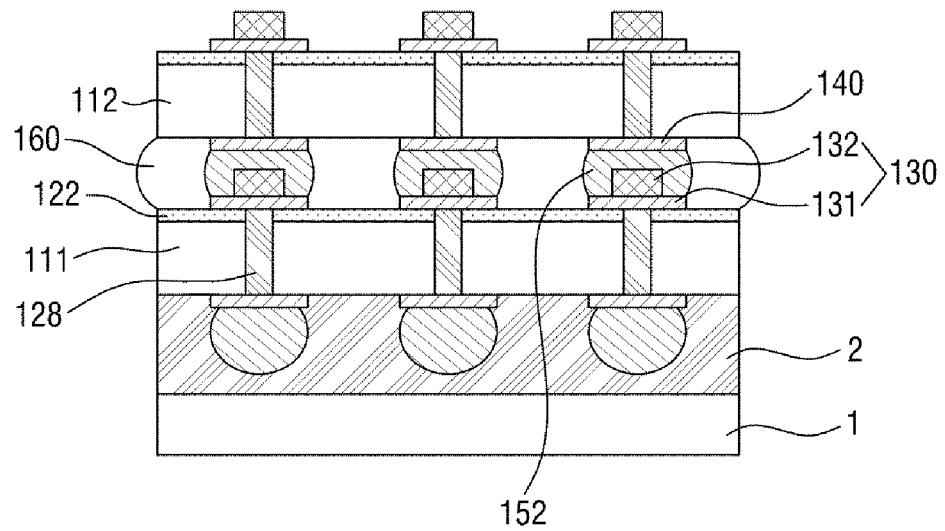
Figure 25:
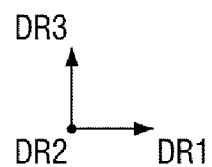

Referring to FIG. 25, the third semiconductor chip 112 is attached to the top surface of the second semiconductor chip 111. In this case, the second solder ball 152 formed on the bottom surface of the third semiconductor chip 112 is attached to the first pad 130 formed on the top surface of the second semiconductor chip 111. The second solder ball 152 may surround the sidewall of the second portion 132 of the first pad 130.

Figure 26:
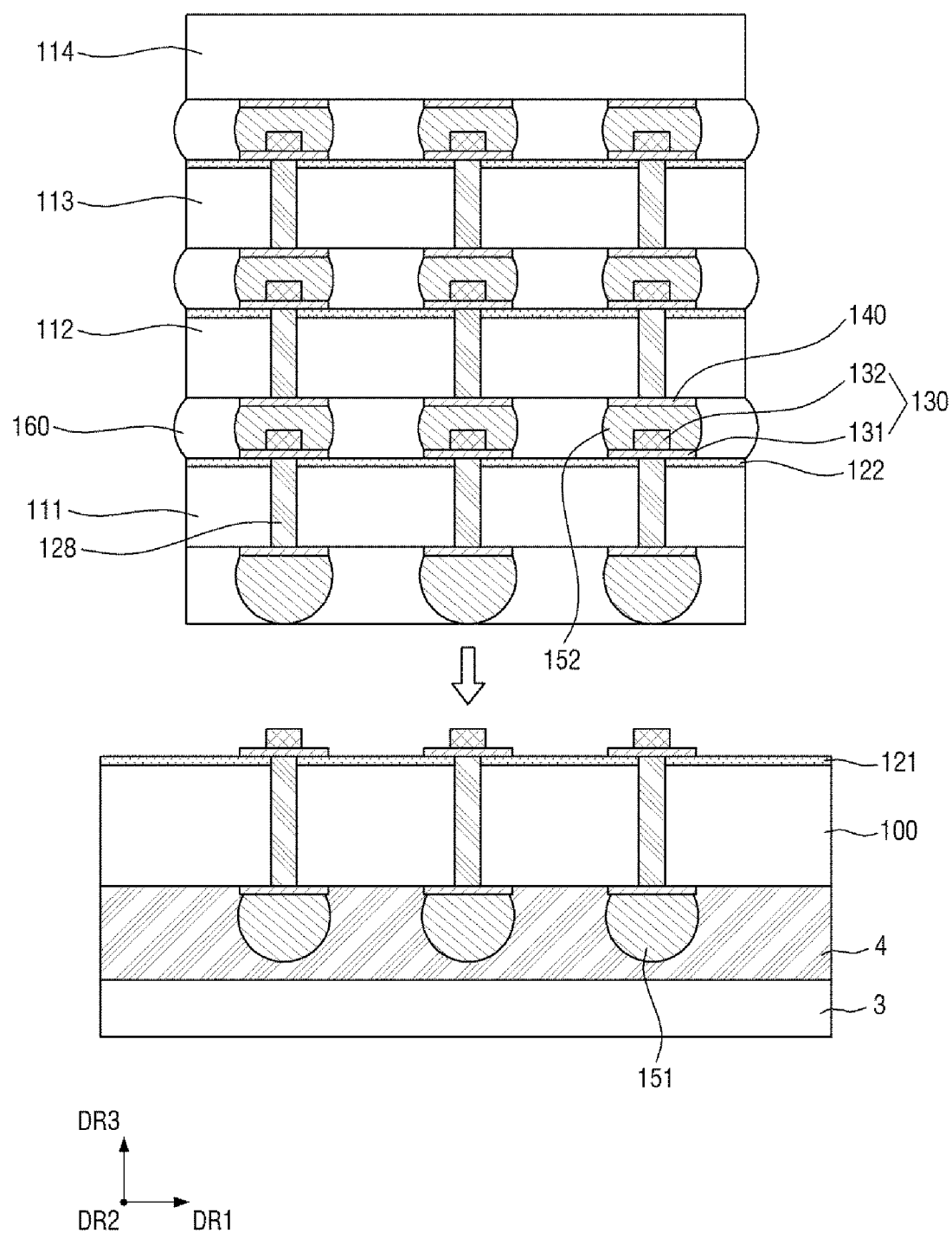

Referring to FIG. 26, the fourth semiconductor chip 113 at which a through via similar to the through via 128, a first pad similar to the first pad 130, a second pad similar to the second pad 140, and a second solder ball similar to the second solder ball 152 are formed, is attached onto the third semiconductor chip 112. In addition, the fifth semiconductor chip 114 on which a second pad similar to the second pad 140 and a second solder ball similar to the second solder ball 152 are formed is attached onto the fourth semiconductor chip 113.

Subsequently, the first release layer 2 and the first carrier substrate 1 formed on the bottom surface of the second semiconductor chip 111 are removed, and then an adhesive layer 160 is formed on the bottom surface of the second semiconductor chip 111. The adhesive layer 160 may cover the second pad 140 and the second solder ball 152, on the bottom surface of the second semiconductor chip 111. Through this process, a stacked structure in which the second to fifth semiconductor chips 111, 112, 113, and 114 are stacked is formed.

Apart from the stacked structure in which the second to fifth semiconductor chips 111, 112, 113, and 114 are stacked, the first semiconductor chip 100 including the first insulating layer 121 is formed. Subsequently, a through via similar to the through via 128 penetrating the first semiconductor chip 100 is formed, and a first pad similar to the first pad 130 is formed on the top surface of the first semiconductor chip 100. Further, a second pad similar to the second pad 140 is formed on the bottom surface of the first semiconductor chip 100, and the first solder ball 151 may be formed in contact with the second pad.

Thereafter, a second release layer 4 is formed on the bottom surface of the first semiconductor chip 100 to cover the second pad and the first solder ball 151. In addition, a second carrier substrate 3 is formed on the bottom surface of the second release layer 4.

Next, the stacked structure in which the second to fifth semiconductor chips 111, 112, 113, and 114 are stacked is attached to the top surface of the first semiconductor chip 100. In this case, the second solder ball 152 formed on the bottom surface of the second semiconductor chip 111 is attached to the first pad formed on the top surface of the first semiconductor chip 100. The second solder ball 152 may surround the sidewall of the second portion of the first pad.

Subsequently, the mold layer 165 (see FIG. 1) is formed on the top surface of the first semiconductor chip 100 to cover the second to fifth semiconductor chips 111, 112, 113, and 114, and then the second release layer 4 and the second carrier substrate 3 are removed. Accordingly, the semiconductor package shown in FIG. 1 may be fabricated.

Hereinafter, a method of fabricating the semiconductor package shown in FIG. 8 will be described with reference to FIGS. 8 and 27 to 31. The following description will focus on differences between the method of fabricating the semiconductor package illustrates in FIGS. 27 to 31 and the method of fabricating the semiconductor package illustrated in FIGS. 22 to 26, and description of like elements, configurations and fabrication processes may be omitted.

FIGS. 27 to 31 illustrate intermediate steps explanatory of a method of fabricating the semiconductor package shown in FIG. 8.

Figure 27:
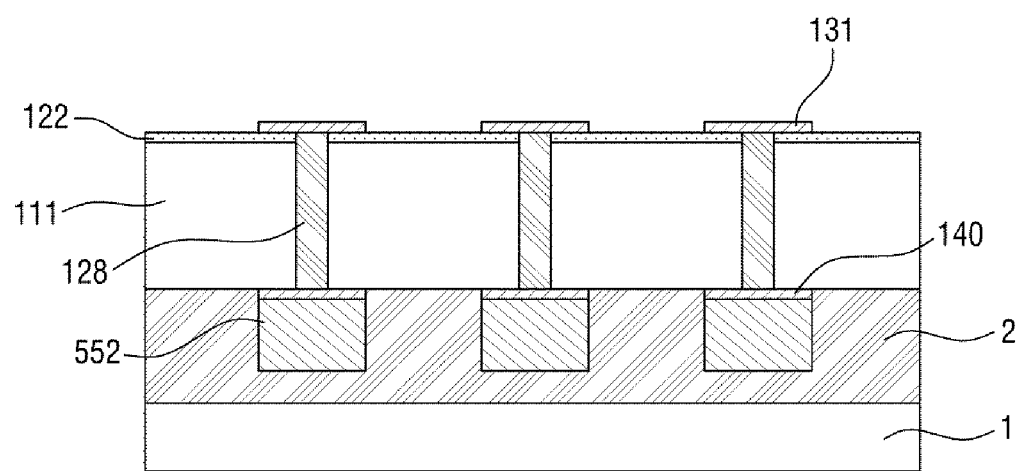
FIGS. 27, 28, 29, 30 and 31 illustrate intermediate steps explanatory of a method of fabricating the semiconductor package shown in FIG. 8 according to embodiments of the inventive concepts.
Figure 27:
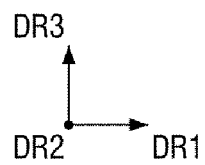

Referring to FIG. 27, a stacked structure including the second insulating layer 122, the second semiconductor chip 111, the through via 128, the first portion 131 of the first pad 530 (see FIG. 8), the second pad 140, and the second solder ball 552 are formed.

The second solder ball 552 may be formed to entirely overlap the second pad 140. In FIG. 27, the second solder ball 552 is shown as having a rectangular cross section, but is not limited thereto.

Subsequently, the first release layer 2 and the first carrier substrate 1 are formed on the bottom surface of the second semiconductor chip 111.

Figure 28:
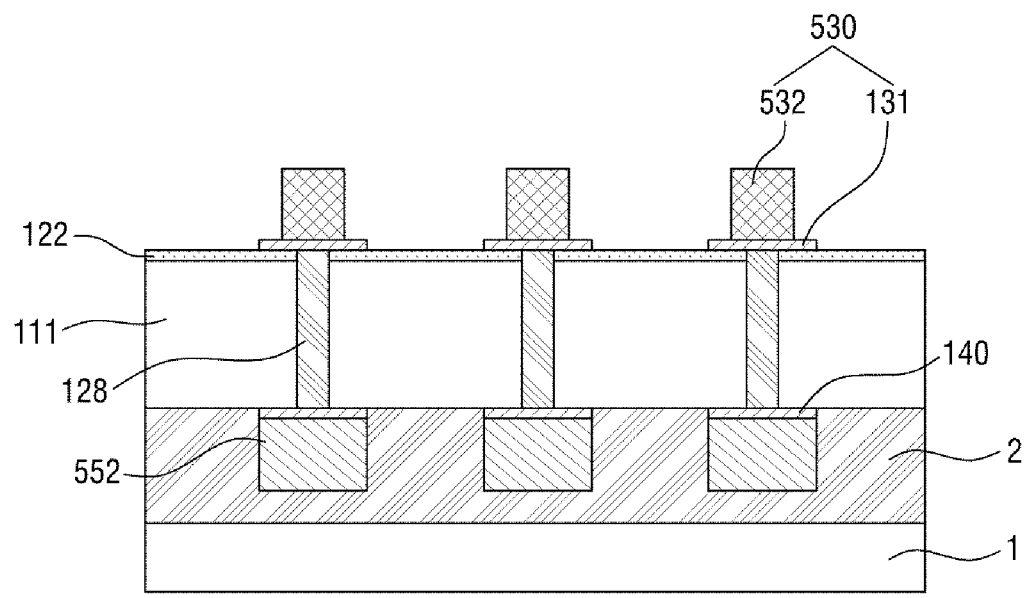
Figure 28:
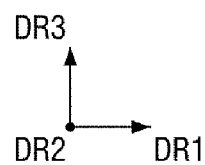

Referring to FIG. 28, the second portion 532 of the first pad 530 is formed on the first portion 131 of the first pad 530. The second portion 532 of the first pad 530 may be formed on the first portion 131 of the first pad 530 using a mask pattern. The width of the second portion 532 of the first pad 530 in the first horizontal direction DR1 may be formed to be smaller than the width of the first portion 131 of the first pad 530 in the first horizontal direction DR1.

The thickness of the second portion 532 of the first pad 530 in the vertical direction DR3 may be formed to be the same as the thickness of the second solder ball 552 in the vertical direction DR3, but is not limited thereto.

Figure 29:
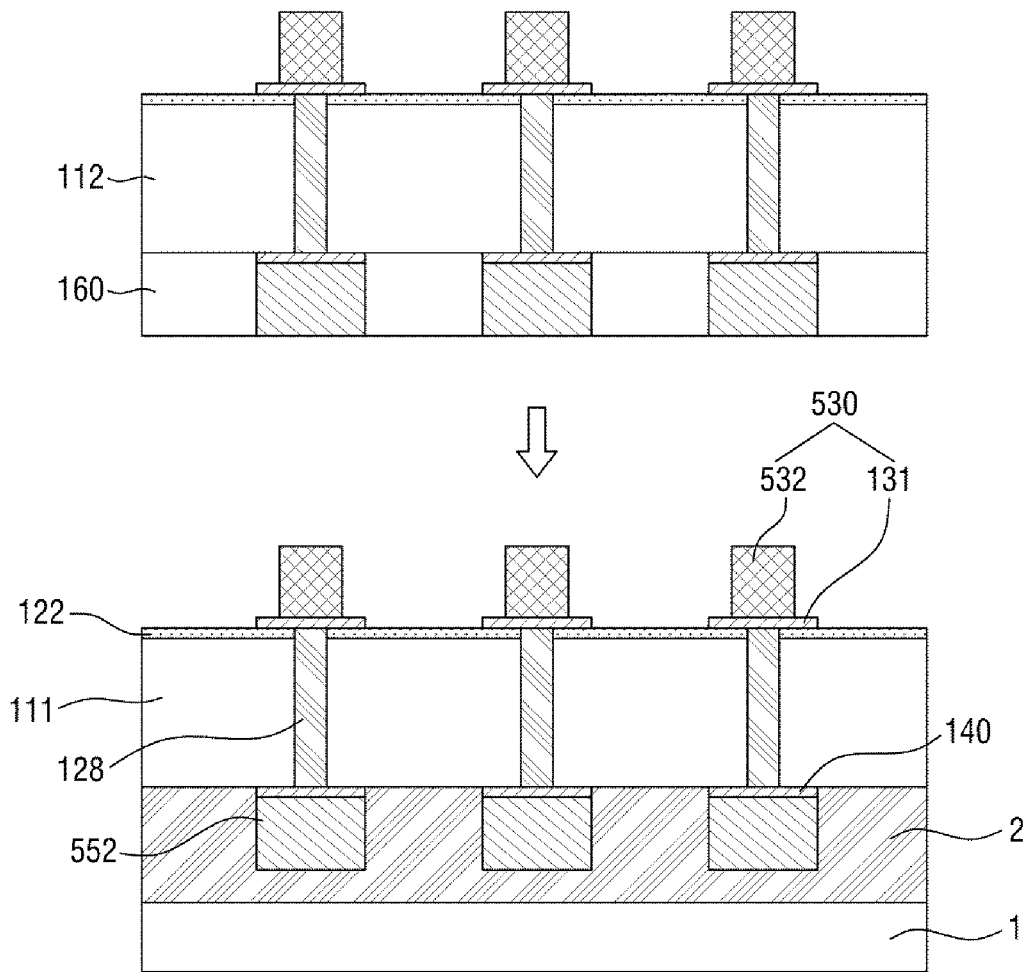
Figure 30:
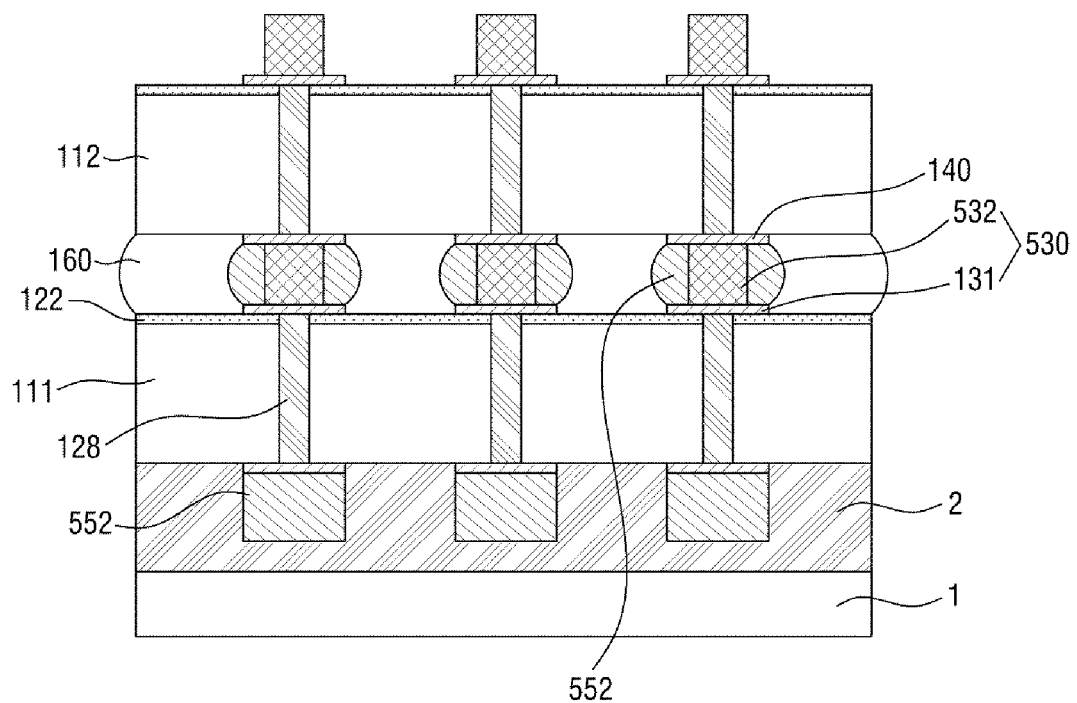
Figure 30:
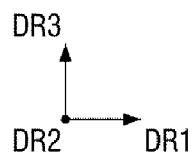
Figure 31:
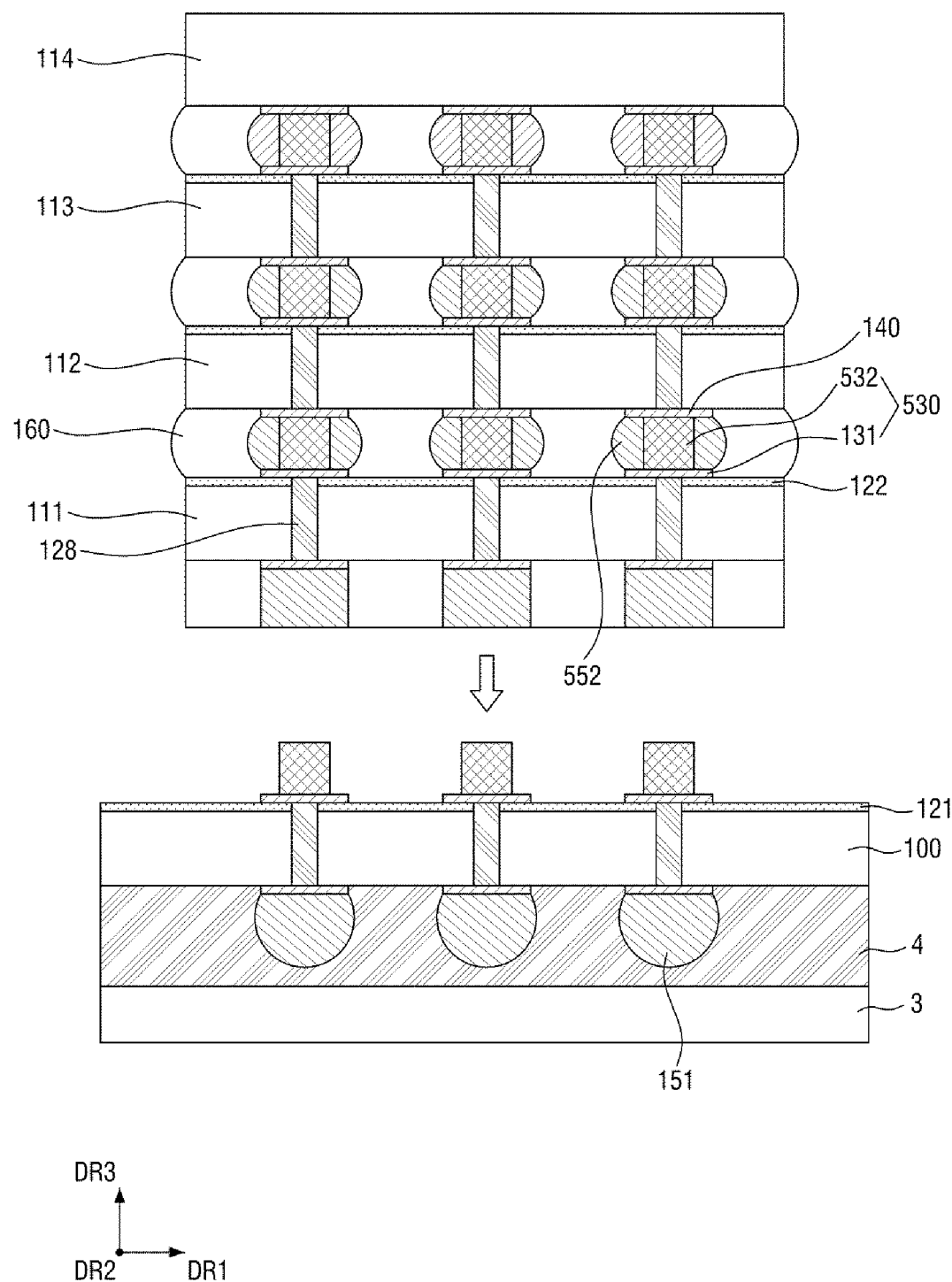

Referring to FIGS. 29 to 31, a stacked structure in which second to fifth semiconductor chips 111, 112, 113, and 114 are stacked is formed similar to FIGS. 24 to 26. In this case, the second portion 532 of the first pad 530 contacts the second pad 140.

Apart from the formation of the stacked structure in which the second to fifth semiconductor chips 111, 112, 113, and 114 are stacked, a stacked structure including the first insulating layer 121, the first semiconductor chip 100, a through via similar to the through via 128, a first pad similar to the first pad 530, a second pad similar to the second pad 140, a first solder ball 151, the second release layer 4, and the second carrier substrate 3 are formed.

Subsequently, the stacked structure in which the second to fifth semiconductor chips 111, 112, 113, and 114 are stacked is attached to the top surface of the first semiconductor chip 100.

Thereafter, the mold layer 165 (see FIG. 8) is formed on the top surface of the first semiconductor chip 100 to cover the second to fifth semiconductor chips 111, 112, 113, and 114, and then the second release layer 4 and the second carrier substrate 3 are removed. Accordingly, the semiconductor package shown in FIG. 8 may be fabricated.

Hereinafter, a method of fabricating the semiconductor package shown in FIG. 14 will be described with reference to FIGS. 14, 32 and 33. The following description will focus on differences between the method of fabricating the semiconductor package illustrated in FIGS. 32 and 34 and the method of fabricating the semiconductor package illustrated in FIGS. 22 to 26, and description of like elements, configurations and fabrication processes may be omitted.

Figure 32:
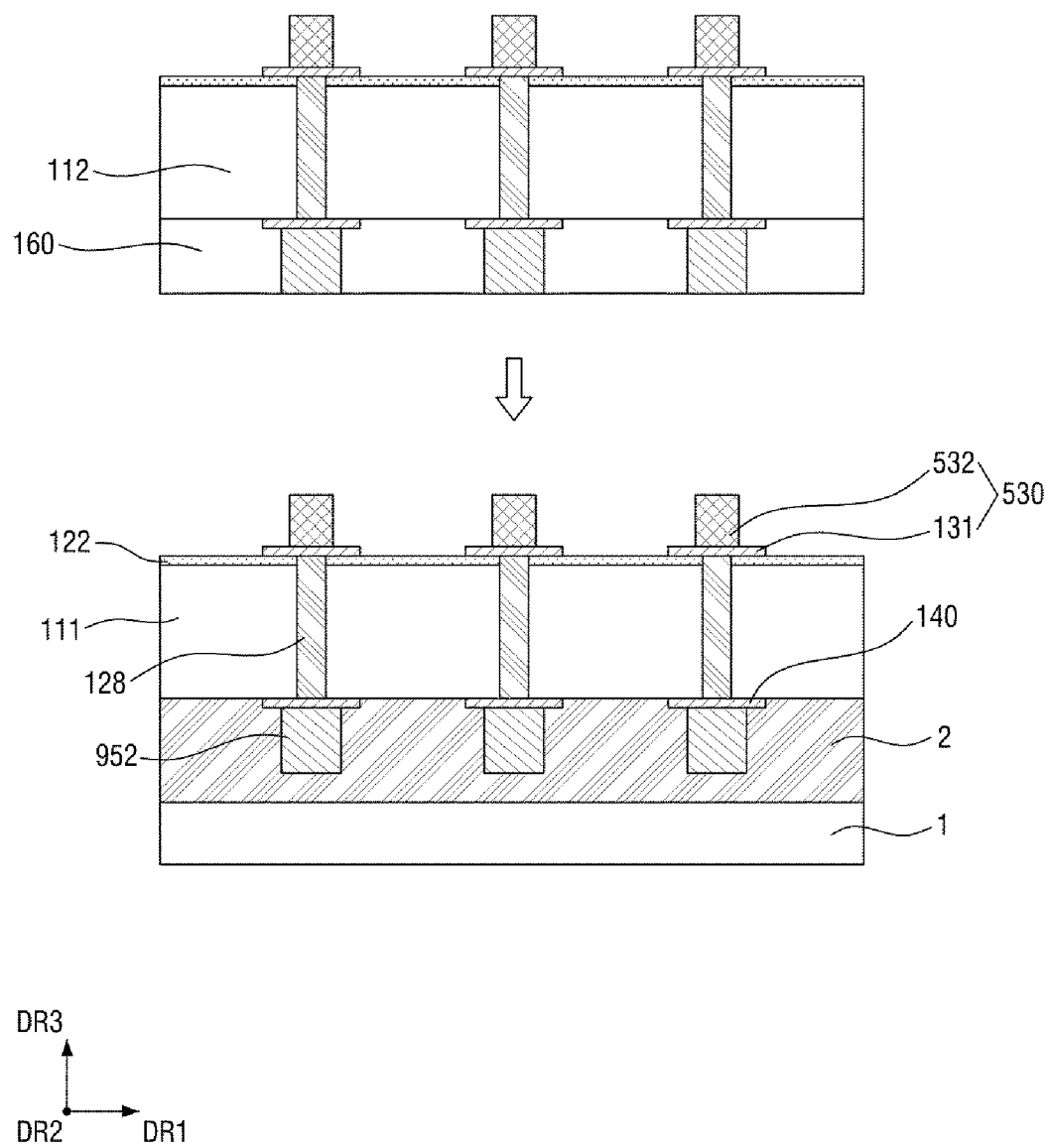
FIGS. 32 and 33 illustrate intermediate steps explanatory of a method of fabricating the semiconductor package shown in FIG. 14 according to embodiments of the inventive concepts.
Figure 33:
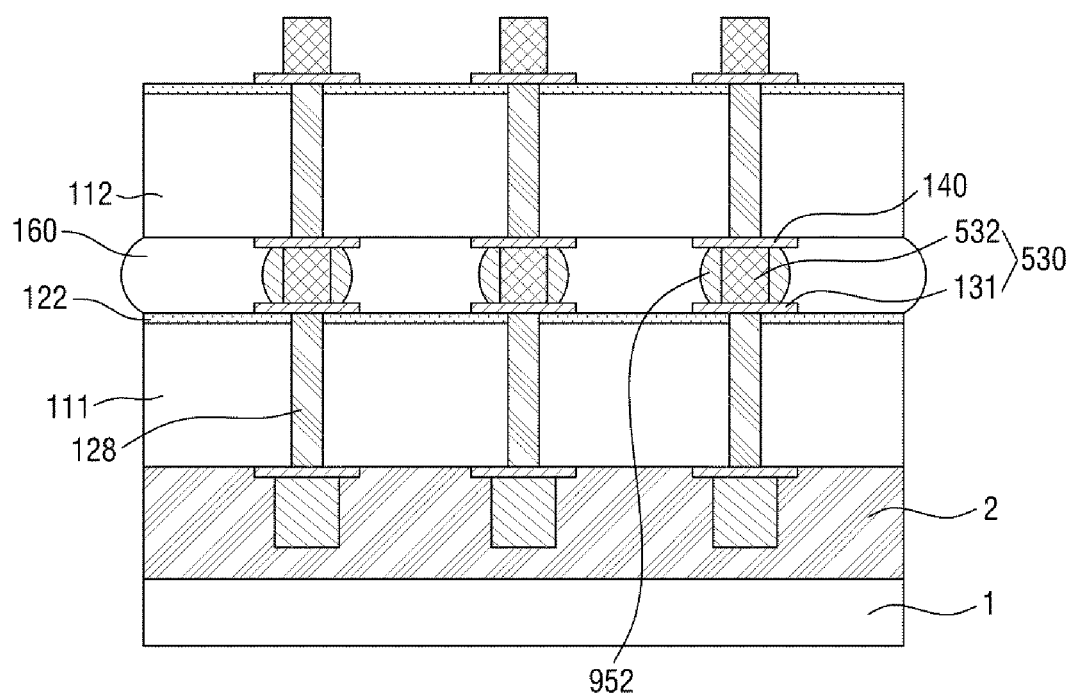
Figure 33:
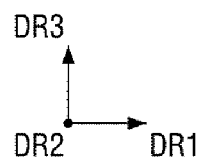

FIGS. 32 and 33 illustrate intermediate steps explanatory of a method of fabricating the semiconductor package shown in FIG. 14.

Referring to FIG. 32, a stacked structure in which the second and third semiconductor chips 111 and 112 are stacked is formed similar to FIGS. 29 and 30. In this case, the second portion 532 of the first pad 530 contacts the second pad 140 as shown in FIG. 33. In addition, the width of the second solder ball 952 in the first horizontal direction DR1 may be formed to be smaller than the width of the first portion 131 of the first pad 530 in the first horizontal direction DR1.

Subsequently, similarly to FIG. 31, a stacked structure in which the second to fifth semiconductor chips 111, 112, 113, and 114 are stacked is formed. In addition, a stacked structure including the first semiconductor chip 100, a second release layer similar to the second release layer 4, and a second carrier substrate similar to the second carrier substrate 3 is formed.

Thereafter, the stacked structure in which the second to fifth semiconductor chips 111, 112, 113, and 114 are stacked is attached to the top surface of the first semiconductor chip 100. Next, the mold layer 165 (see FIG. 14) is formed on the top surface of the first semiconductor chip 100 to cover the second to fifth semiconductor chips 111, 112, 113, and 114, and then the second release layer and the second carrier substrate are removed. Accordingly, the semiconductor package shown in FIG. 14 may be fabricated.

In concluding the detailed description, those skilled in the art should appreciate that many variations and modifications can be made to the embodiments without substantially departing from the inventive concepts. Therefore, the disclosed embodiments of the inventive concepts are used in a generic and descriptive sense only and not for purposes of limitation.

What is claimed is:

1. A semiconductor package comprising:
    a first semiconductor chip;
    a second semiconductor chip on the first semiconductor chip;
    a third semiconductor chip on the second semiconductor chip;
    a first pad on a top surface of the second semiconductor chip, the first pad including a first portion and a second portion protruding in a vertical direction from the first portion, a width of the first portion in a first horizontal direction being greater than a width of the second portion in the first horizontal direction;
    a second pad on a bottom surface of the third semiconductor chip, the bottom surface facing the top surface of the second semiconductor chip; and
    a solder ball surrounding a sidewall of the second portion of the first pad between the first pad and the second pad.

2. The semiconductor package of claim 1, wherein a thickness of the second portion of the first pad in the vertical direction is greater than a thickness of the first portion of the first pad in the vertical direction.

3. The semiconductor package of claim 2, wherein the thickness of the first portion of the first pad in the vertical direction is 0.1 μm to 2 μm, and
    the thickness of the second portion of the first pad in the vertical direction is 0.1 μm to 5 μm.

4. The semiconductor package of claim 1, wherein the first pad further includes a first metal layer on a top surface of the second portion of the first pad.

5. The semiconductor package of claim 1, wherein the second pad includes a first portion and a second portion protruding in the vertical direction from the first portion of the second pad, and
    a width of the first portion of the second pad in the first horizontal direction is greater than a width of the second portion of the second pad in the first horizontal direction.

6. The semiconductor package of claim 5, wherein the width of the second portion of the second pad in the first horizontal direction is the same as the width of the second portion of the first pad in the first horizontal direction.

7. The semiconductor package of claim 5, wherein the first pad further includes a first metal layer on a top surface of the second portion of the first pad, and
    the second pad further includes a second metal layer on a bottom surface of the second portion of the second pad.

8. The semiconductor package of claim 1, wherein the second portion of the first pad is in contact with the second pad.

9. The semiconductor package of claim 8, wherein the first pad further includes a first metal layer on a top surface of the second portion of the first pad and a second metal layer on a top surface of the first portion of the first pad, and
    the second pad further includes a third metal layer on a bottom surface of the second pad.

10. The semiconductor package of claim 8, further comprising:
    an adhesive layer surrounding a sidewall of the first pad; and
    an insulating layer surrounding at least a portion of a sidewall of the solder ball and a sidewall of the second pad.

11. The semiconductor package of claim 8, wherein a width of the solder ball in the first horizontal direction is smaller than the width of the first portion of the first pad in the first horizontal direction.

12. The semiconductor package of claim 1, wherein a width of the first portion of the first pad in a second horizontal direction perpendicular to the first horizontal direction is greater than a width of the second portion of the first pad in the second horizontal direction.

13. The semiconductor package of claim 1, wherein a difference between the width of the first portion of the first pad in the first horizontal direction and the width of the second portion of the first pad in the first horizontal direction is 1 μm to 8 μm.

14. A semiconductor package comprising:
    a first structure;
    a second structure on the first structure;
    a first pad on a top surface of the first structure, the first pad including a first portion and a second portion protruding in a vertical direction from the first portion, a width of the first portion in a first horizontal direction being greater than a width of the second portion in the first horizontal direction;
    a second pad on a bottom surface of the second structure, the bottom surface facing the top surface of the first structure; and
    a solder ball between the first pad and the second pad and surrounding a sidewall of the second portion of the first pad,
    wherein the second portion of the first pad is in contact with the second pad, and a width of the solder ball in the first horizontal direction is smaller than the width of the first portion of the first pad in the first horizontal direction.

15. The semiconductor package of claim 14, further comprising:
a first semiconductor chip under the first structure,
wherein the first structure is a second semiconductor chip, and
the second structure is a third semiconductor chip.

16. The semiconductor package of claim 14, further comprising a substrate under the first structure,
wherein the first structure is an interposer,
the second structure includes a first semiconductor chip and a second semiconductor chip spaced apart from the first semiconductor chip in the first horizontal direction, and
the first semiconductor chip is electrically connected to the second semiconductor chip through the first structure.

17. The semiconductor package of claim 14, further comprising first and second semiconductor chips spaced apart from each other in the first horizontal direction on the second structure,
wherein the first structure is a substrate,
the second structure is an interposer, and
the first semiconductor chip is electrically connected to the second semiconductor chip through the second structure.

18. The semiconductor package of claim 14, wherein the first structure is a first package including a first semiconductor chip, and the second structure is a second package including a second semiconductor chip.

19. The semiconductor package of claim 14, wherein the first structure is a substrate, and the second structure is a semiconductor chip.

20. A semiconductor package comprising:
a first semiconductor chip;
a second semiconductor chip on the first semiconductor chip;
a third semiconductor chip on the second semiconductor chip;
a first pad on a top surface of the second semiconductor chip, the first pad including a first portion and a second portion protruding in a vertical direction from the first portion, a width of the first portion in a first horizontal direction being greater than a width of the second portion in the first horizontal direction, a width of the first portion in a second horizontal direction perpendicular to the first horizontal direction being greater than a width of the second portion in the second horizontal direction;
a second pad on a bottom surface of the third semiconductor chip, the bottom surface facing the top surface of the second semiconductor chip;
a first solder ball on a bottom surface of the first semiconductor chip;
a second solder ball between the first pad and the second pad, and surrounding a sidewall of the second portion of the first pad;
a through via penetrating the second semiconductor chip in the vertical direction and connected to the first pad; and
an adhesive layer between the second semiconductor chip and the third semiconductor chip, and surrounding a sidewall of each of the first pad, the second pad, and the second solder ball,
wherein a thickness of the second portion of the first pad in the vertical direction is greater than a thickness of the first portion of the first pad in the vertical direction,
a thickness of the first portion of the first pad in the vertical direction is 0.1 µm to 2 µm, and
a thickness of the second portion of the first pad in the vertical direction is 0.1 µm to 5 µm.

* * * * *